US012813198B2

(12) United States Patent
Sunaga et al.

(10) Patent No.: US 12,813,198 B2
(45) Date of Patent: Nov. 24, 2026

(54) STAMP TOOL HOLDING APPARATUS, STAMP TOOL POSITIONING APPARATUS, MULTI-COMPONENT TRANSFER APPARATUS, AND METHOD FOR MANUFACTURING ELEMENT ARRAY

(71) Applicant: TDK CORPORATION, Tokyo (JP)

(72) Inventors: Seijiro Sunaga, Tokyo (JP); Makoto Yamashita, Tokyo (JP); Toshinobu Miyagoshi, Tokyo (JP); Yasuo Kato, Tokyo (JP); Tatsunori Otomo, Tokyo (JP); Mitsuyoshi Makida, Tokyo (JP); Yohei Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 147 days.

(21) Appl. No.: 17/915,349

(22) PCT Filed: Mar. 30, 2021

(86) PCT No.: PCT/JP2021/013698
§ 371 (c)(1),
(2) Date: Sep. 28, 2022

(87) PCT Pub. No.: WO2021/201038
PCT Pub. Date: Oct. 7, 2021

(65) Prior Publication Data

US 2023/0140856 A1 May 11, 2023

(30) Foreign Application Priority Data

Mar. 30, 2020 (JP) ................................ 2020-060506
Jun. 22, 2020 (JP) ................................ 2020-107135
(Continued)

(51) Int. Cl.
*H10P 72/00* (2026.01)
*B29C 59/02* (2006.01)
(Continued)

(52) U.S. Cl.
CPC ........ *H10P 72/0442* (2026.01); *B29C 59/026* (2013.01); *B41K 3/64* (2013.01);
(Continued)

(58) Field of Classification Search
CPC ......... H01L 21/67132; H01L 21/67144; H01L 21/681; H01L 21/6838; H01L 21/68707;
(Continued)

(56) References Cited

U.S. PATENT DOCUMENTS

2017/0103908 A1 4/2017 Lew et al.
2017/0173852 A1 6/2017 Moore et al.
(Continued)

FOREIGN PATENT DOCUMENTS

CN 108028208 A 5/2018
JP 2017-175087 A 9/2017
(Continued)

OTHER PUBLICATIONS

Sep. 29, 2022 International Preliminary Report on Patentability issued in International Patent Application No. PCT/JP2021/013698.
(Continued)

*Primary Examiner* — S. Behrooz Ghorishi
(74) *Attorney, Agent, or Firm* — Oliff PLC

(57) ABSTRACT

A stamp tool holding device capable of holding a stamp tool while keeping a stamp surface of the stamp tool clean, a stamp tool positioning device that easily positions a stamp tool with respect to a transport head, a multi-element transfer device for efficiently transferring a transport object element such as an element using a stamp tool, and a method of manufacturing an element array using the same, wherein the stamp tool holding device has an installation stage on which a stamp tool is detachably installed. The installation stage has an installation surface on which a housing recess for accommodating a stamp layer of the stamp tool is formed,
(Continued)

and a suction hole capable of detachably adsorbing a part of the stamp tool located around the stamp layer is formed on the installation surface.

11 Claims, 21 Drawing Sheets

(30) Foreign Application Priority Data

| | | |
|---|---|---|
| Jun. 22, 2020 | (JP) | 2020-107138 |
| Dec. 21, 2020 | (JP) | 2020-211748 |
| Dec. 21, 2020 | (JP) | 2020-211750 |

(51) Int. Cl.

| | |
|---|---|
| ***B29L 7/00*** | (2006.01) |
| ***B41K 3/64*** | (2006.01) |
| ***B65G 47/90*** | (2006.01) |
| ***H05K 13/04*** | (2006.01) |
| ***H10P 72/50*** | (2026.01) |
| ***H10P 72/76*** | (2026.01) |
| ***H10P 72/78*** | (2026.01) |

(52) U.S. Cl.
CPC ......... *B65G 47/90* (2013.01); *H05K 13/0404* (2013.01); *H10P 72/0446* (2026.01); *H10P 72/53* (2026.01); *H10P 72/7602* (2026.01); *H10P 72/78* (2026.01); *B29L 2007/00* (2013.01)

(58) Field of Classification Search
CPC ........... H01L 2224/95001; H01L 21/02; H01L 21/50; H01L 21/677; H01L 21/683; H01L 2924/12041; H01L 21/687; H01L 24/97; H01L 21/68; B29C 59/026; B41K 3/64; B41K 99/00; B65G 47/90; H05K 13/0404; H05K 13/04; B29L 2007/00; B41F 17/001; B41F 17/24; Y02P 70/50
See application file for complete search history.

(56) References Cited

U.S. PATENT DOCUMENTS

| | | | | |
|---|---|---|---|---|
| 2019/0067237 | A1 | 2/2019 | Kitazawa | |
| 2019/0355610 | A1* | 11/2019 | Ahn | H01L 21/67712 |
| 2020/0006279 | A1 | 1/2020 | Kitazawa | |
| 2020/0286850 | A1 | 9/2020 | Seyama et al. | |
| 2021/0050242 | A1* | 2/2021 | Sakata | H01L 21/6838 |
| 2021/0335747 | A1 | 10/2021 | Kitazawa | |
| 2022/0124949 | A1* | 4/2022 | Nakagawa | H05K 13/0409 |
| 2023/0187258 | A1 | 6/2023 | Sunaga et al. | |

FOREIGN PATENT DOCUMENTS

| | | |
|---|---|---|
| JP | 2018-533212 A | 11/2018 |
| TW | 201836043 A | 10/2018 |

OTHER PUBLICATIONS

Sep. 29, 2022 International Preliminary Report on Patentability issued in International Patent Application No. PCT/JP2021/013697.
U.S. Appl. No. 17/915,320, filed Sep. 28, 2022 in the name of Sunaga et al.
Feb. 11, 2025 U.S. Office Action issued in U.S. Appl. No. 17/915,320.
Translation of JP2017175087A, dated Feb. 6, 2025.
Jun. 5, 2025 Notice of Allowance received in U.S. Appl. No. 17/915,320.

* cited by examiner

[FIG. 1A]
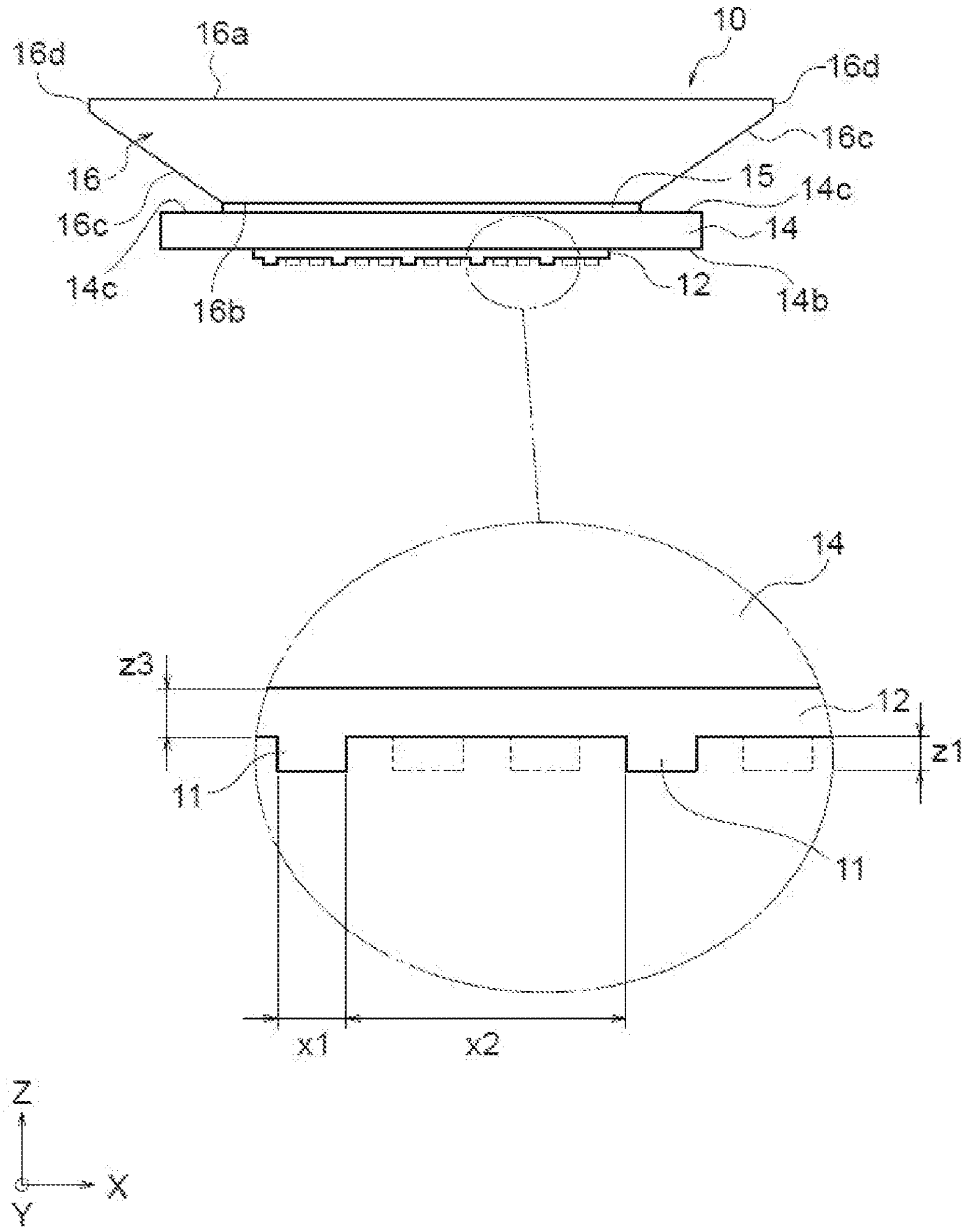

[FIG. 1B]
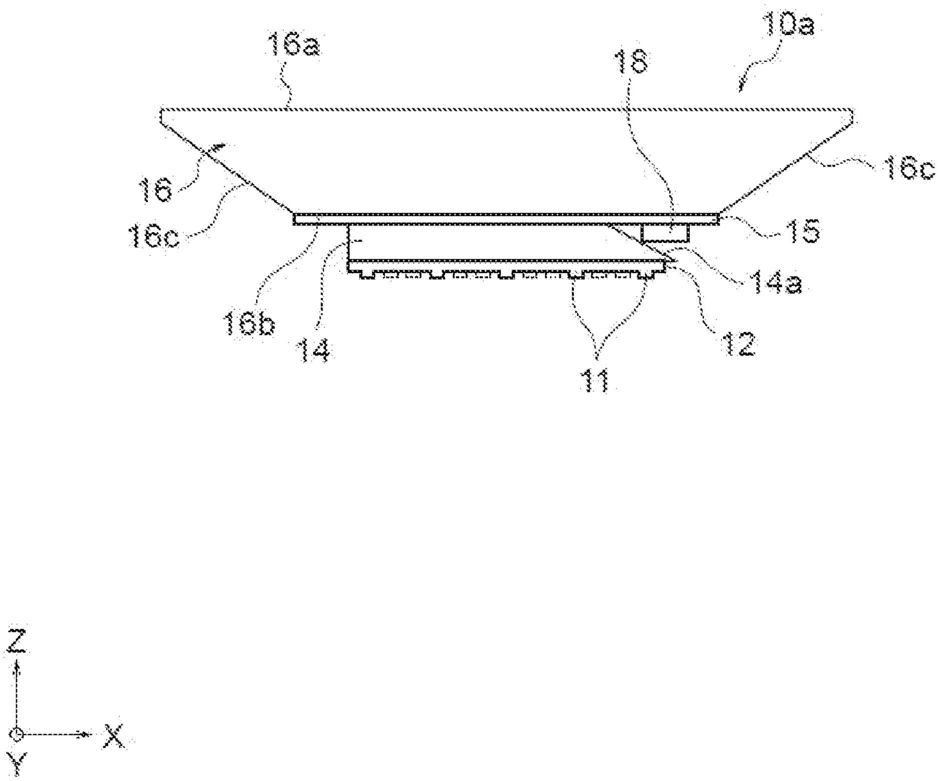

[FIG. 1C]
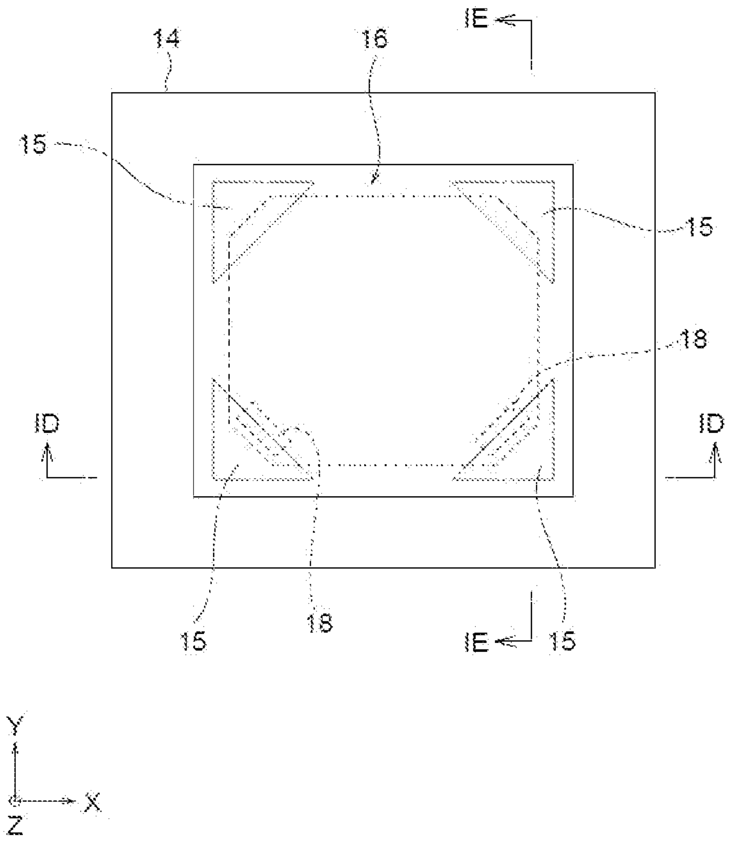
[FIG. 1D]
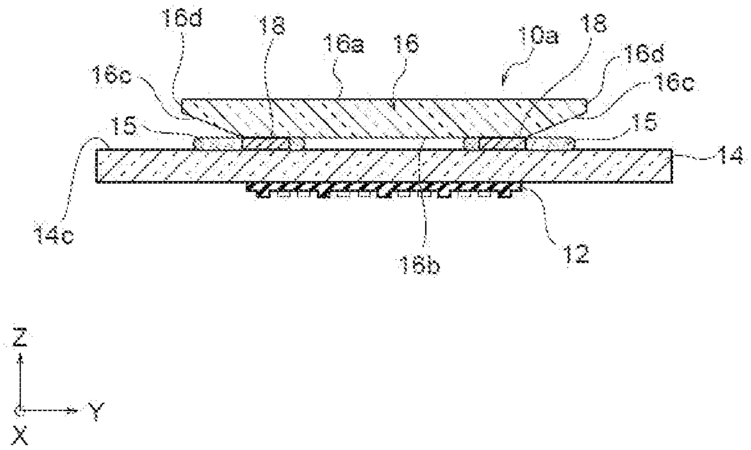

[FIG. 1E]
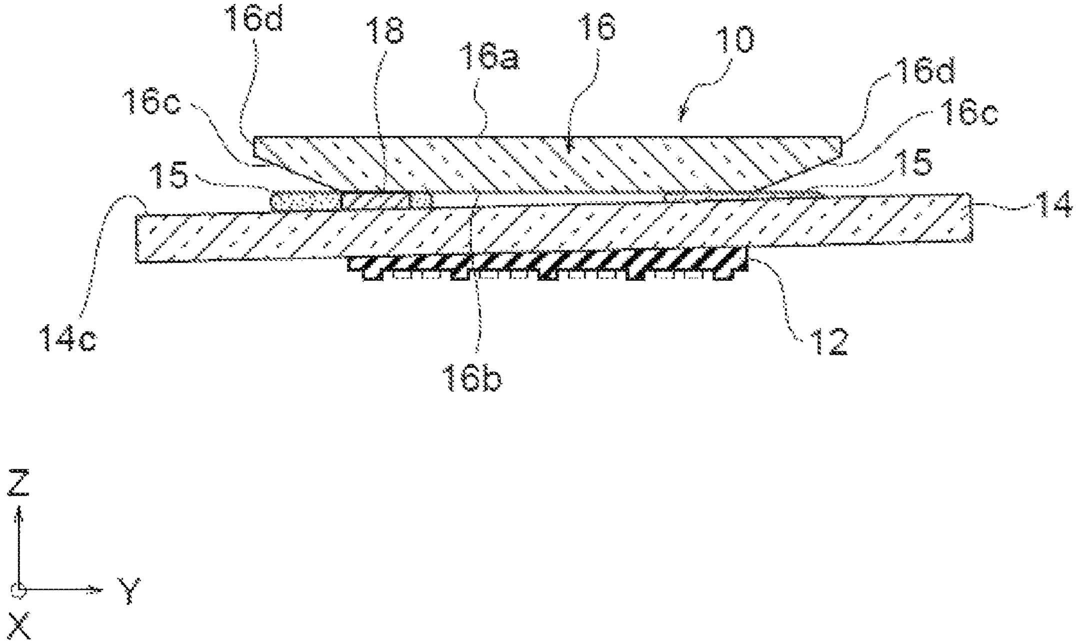

[FIG. 2A]
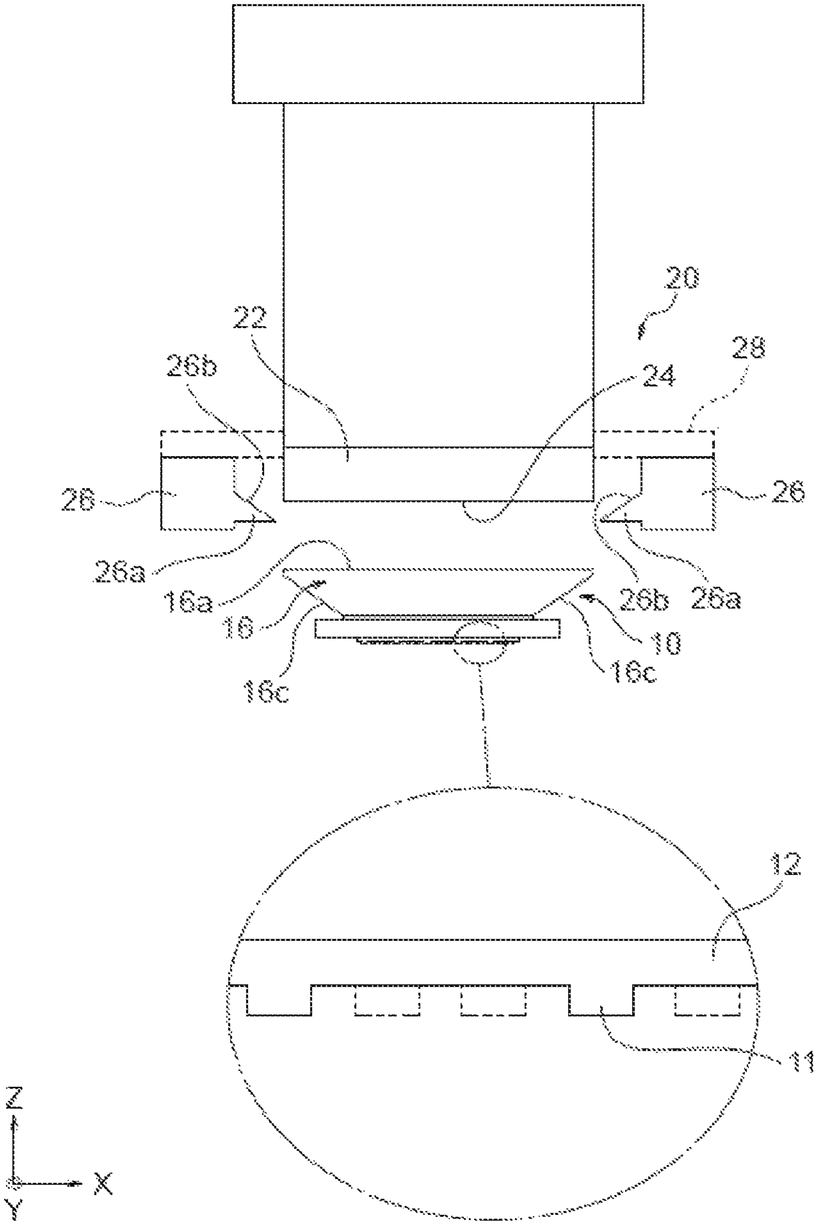

[FIG. 2B]
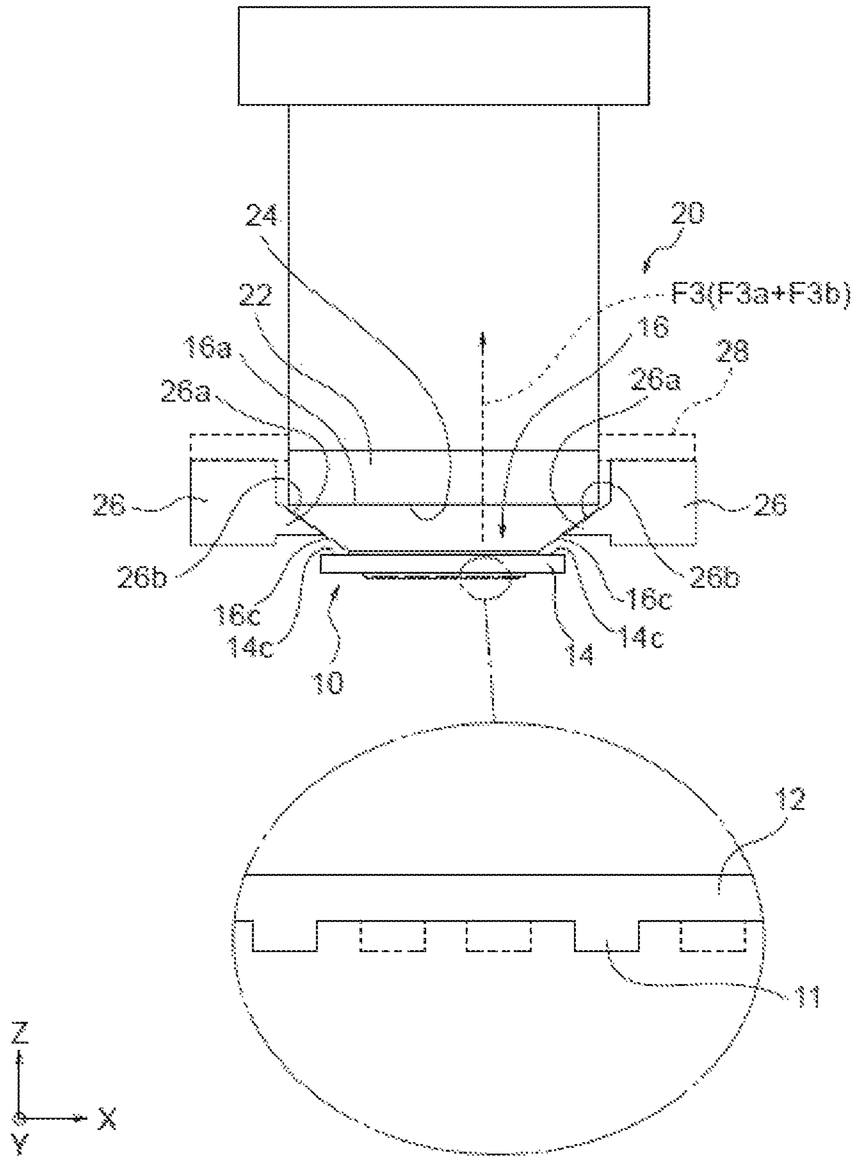

[FIG. 3A]
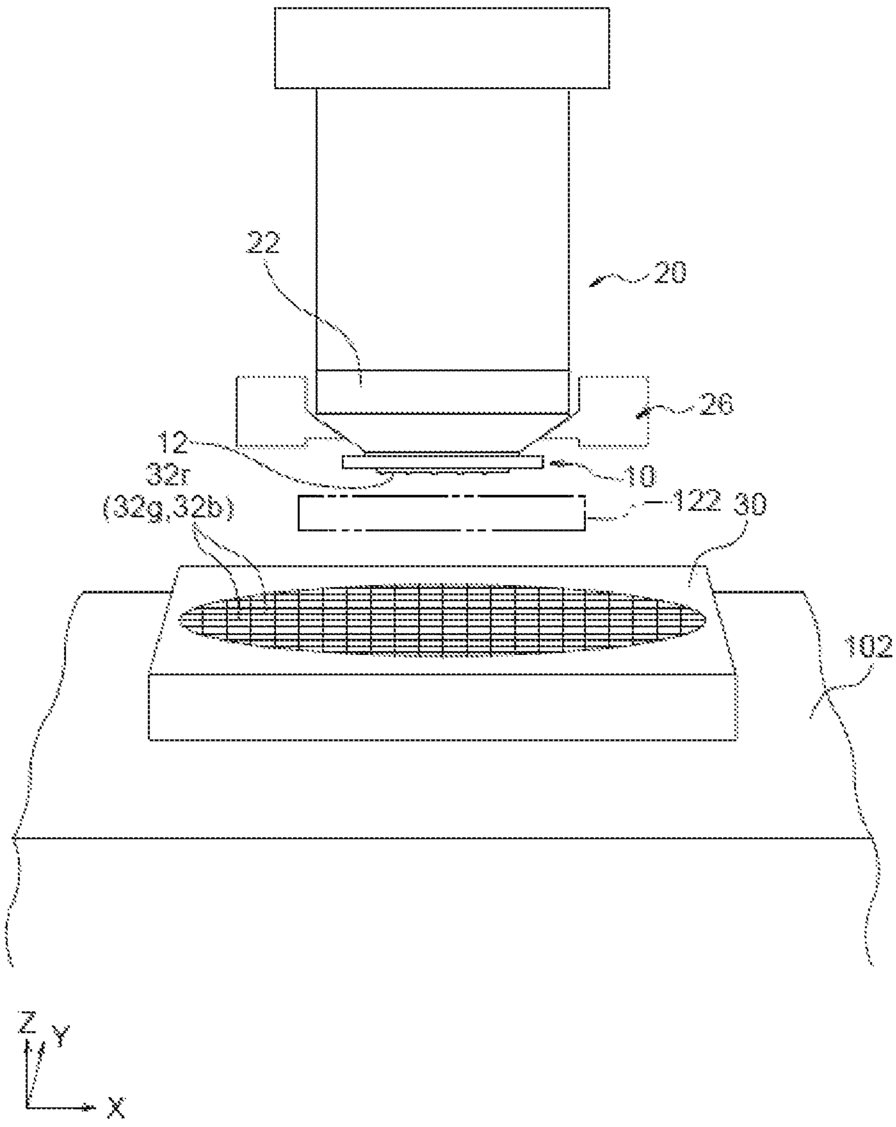

[FIG. 3B]
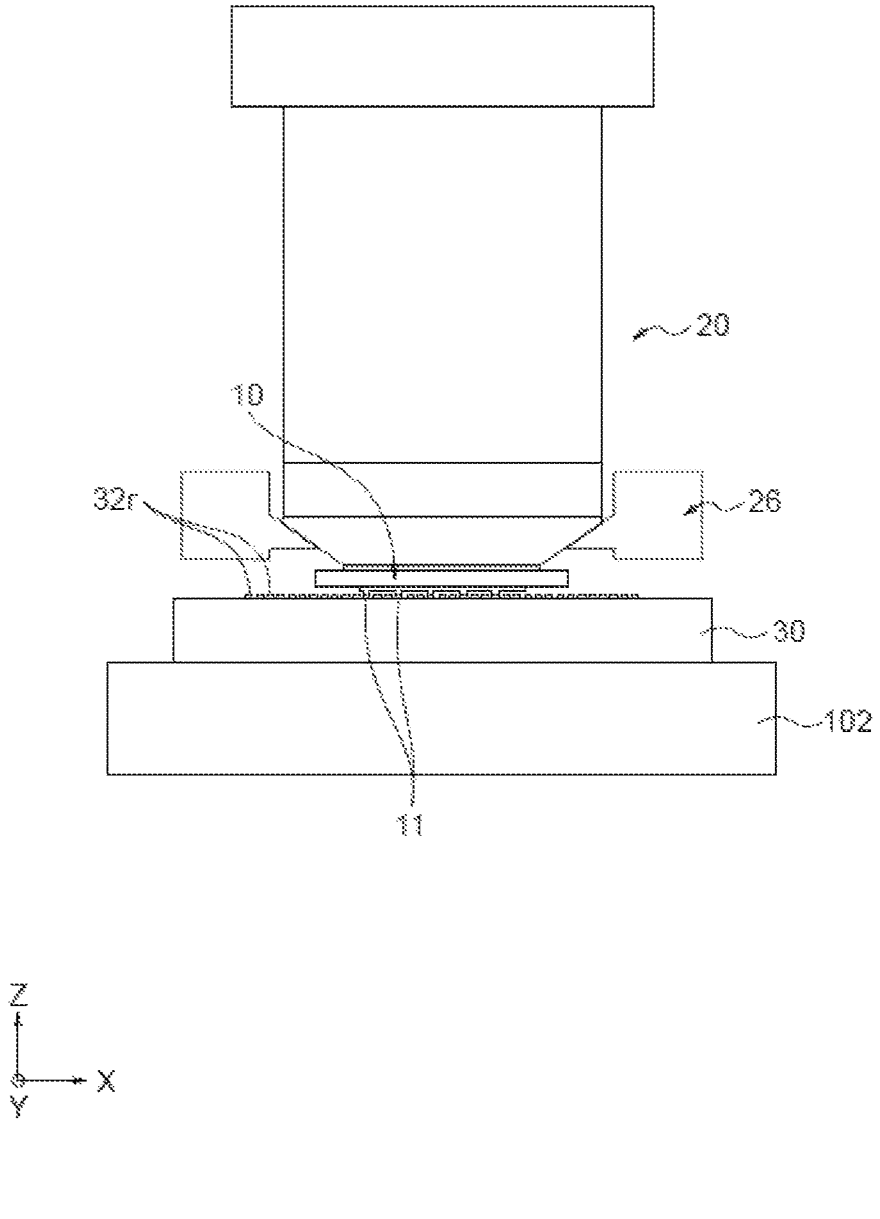

[FIG. 3C]
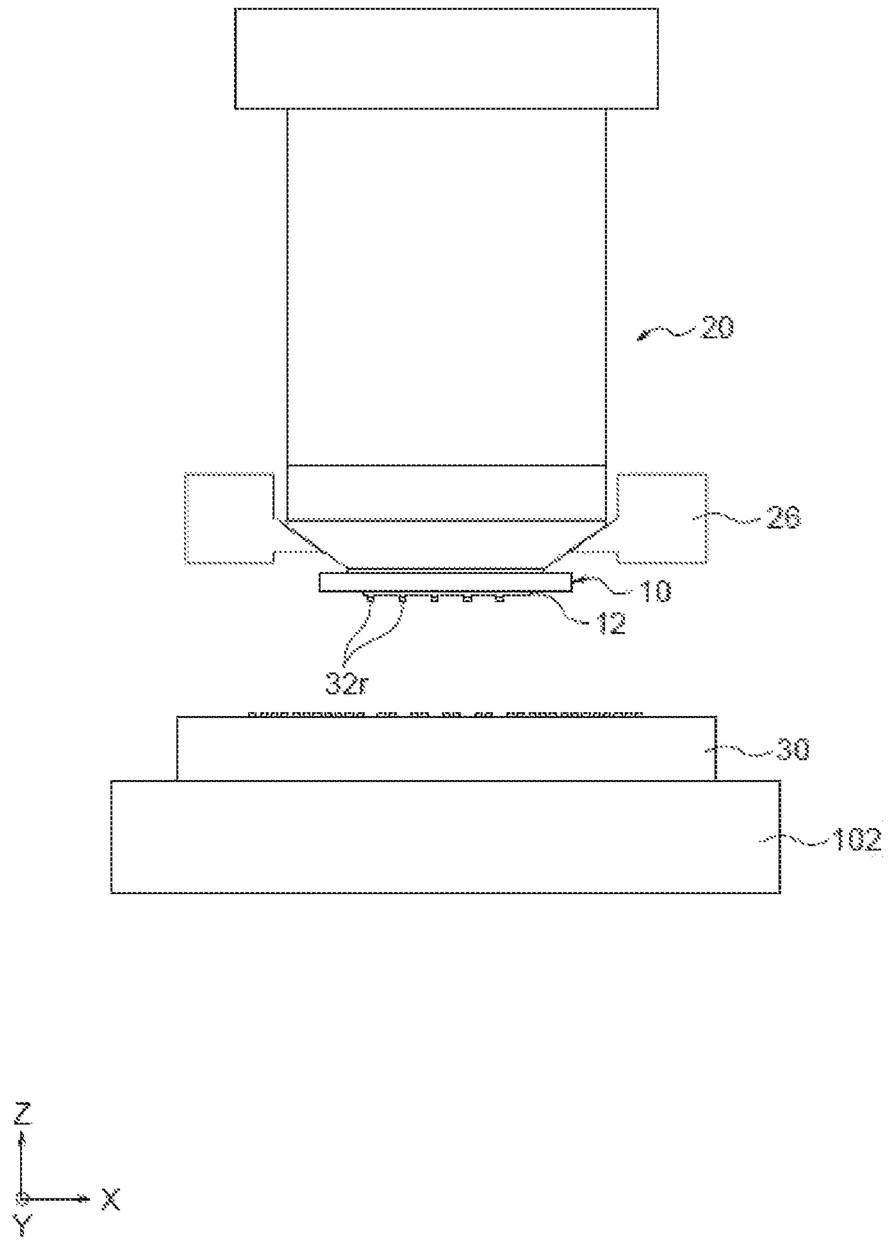

[FIG. 4A]
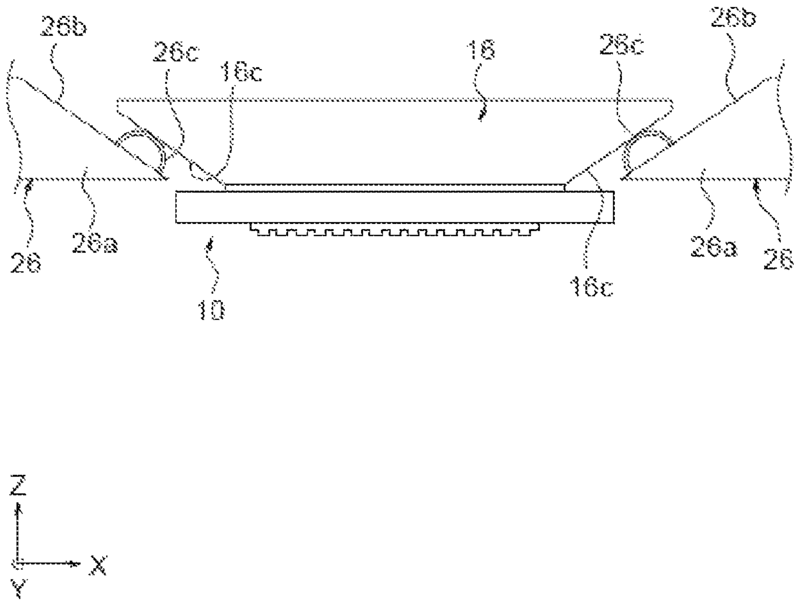
[FIG. 4B]
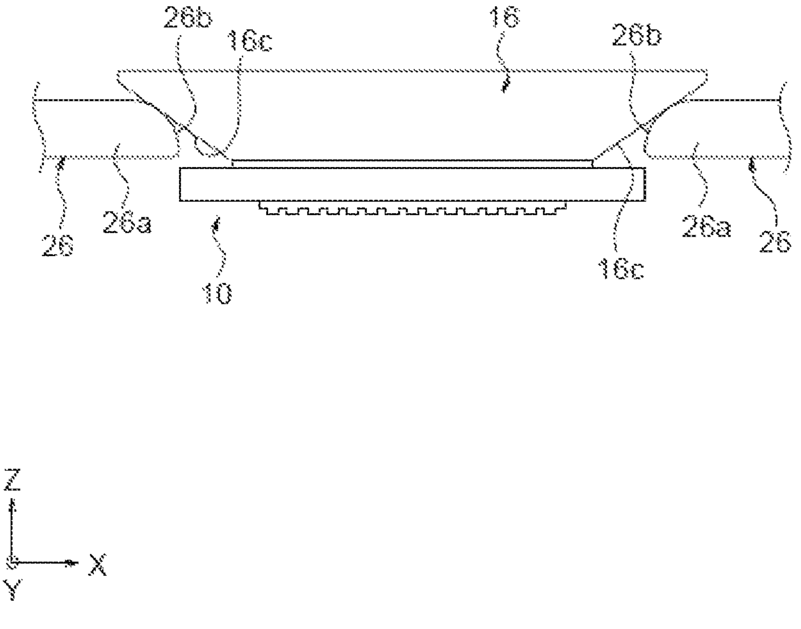

[FIG. 5A]
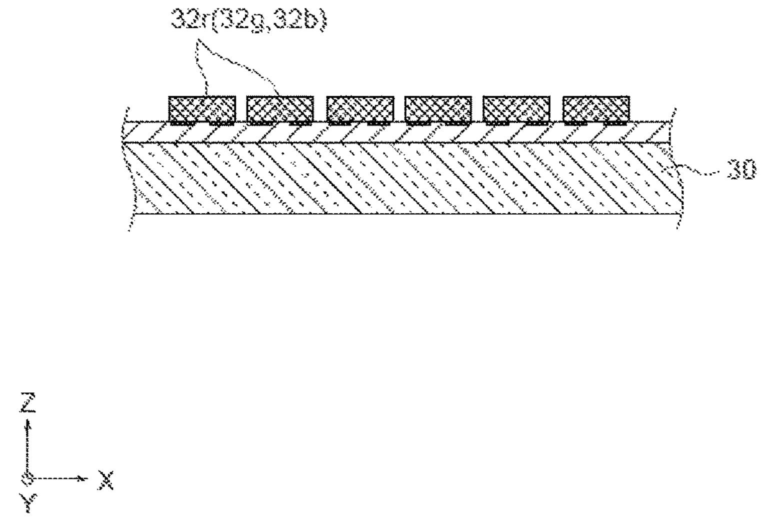
[FIG. 5B]
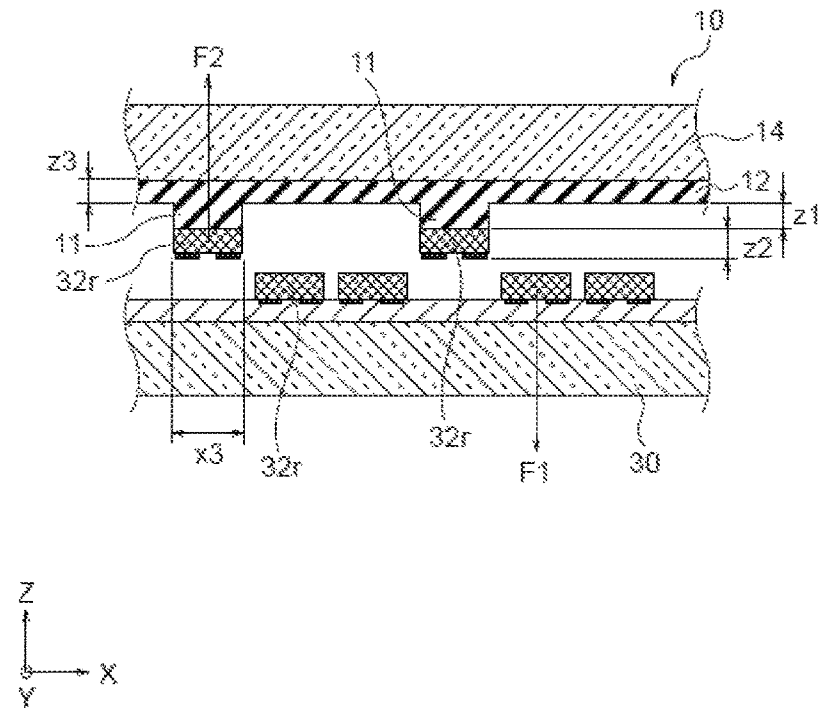

[FIG. 5C1]
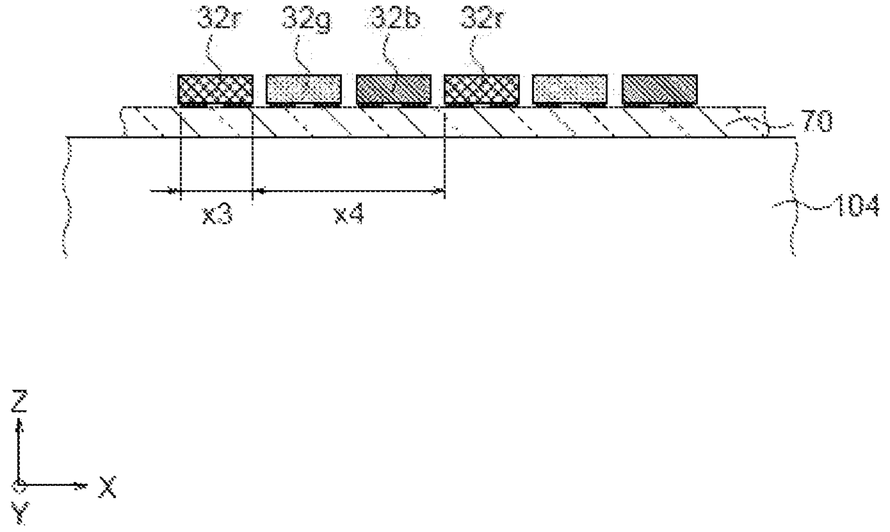
[FIG. 5C2]
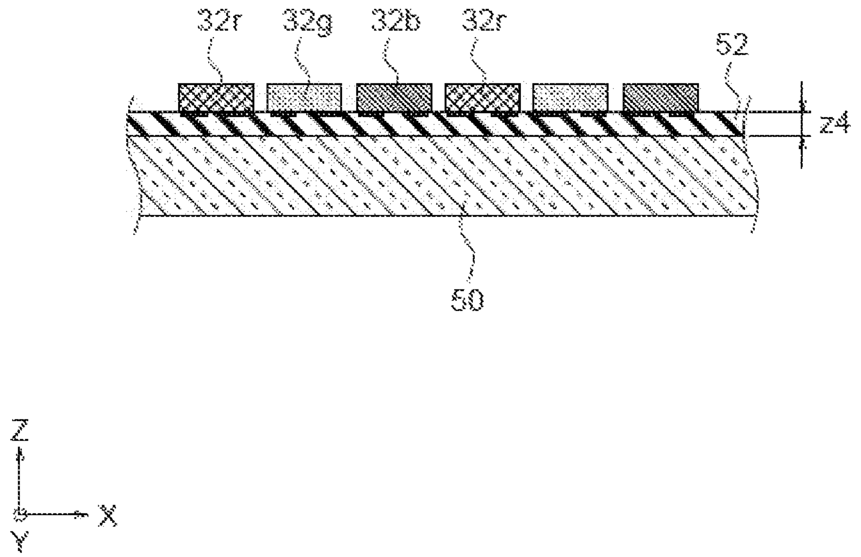

[FIG. 5D]
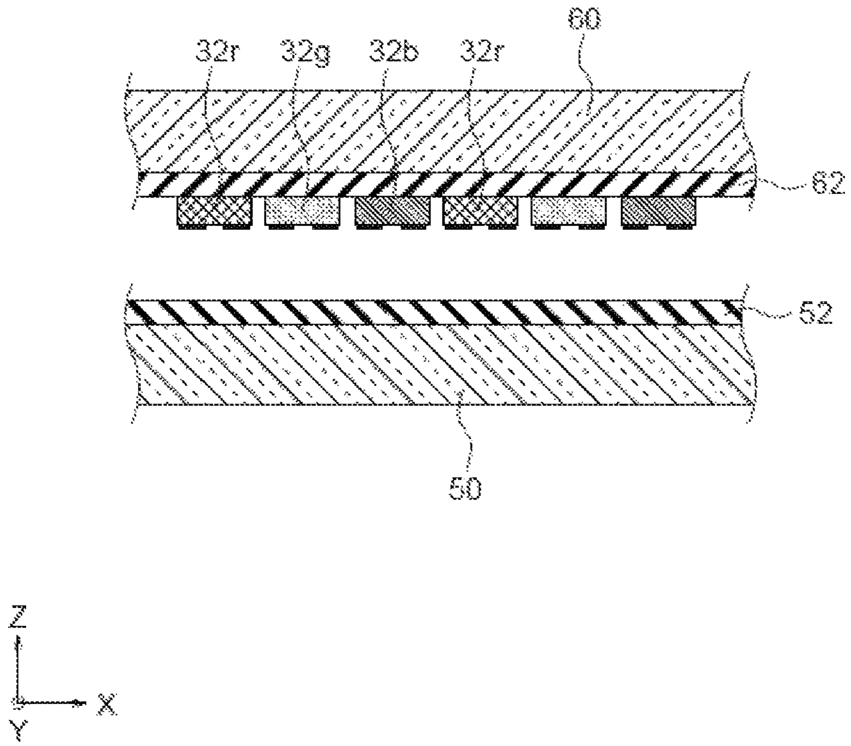

[FIG. 5E]
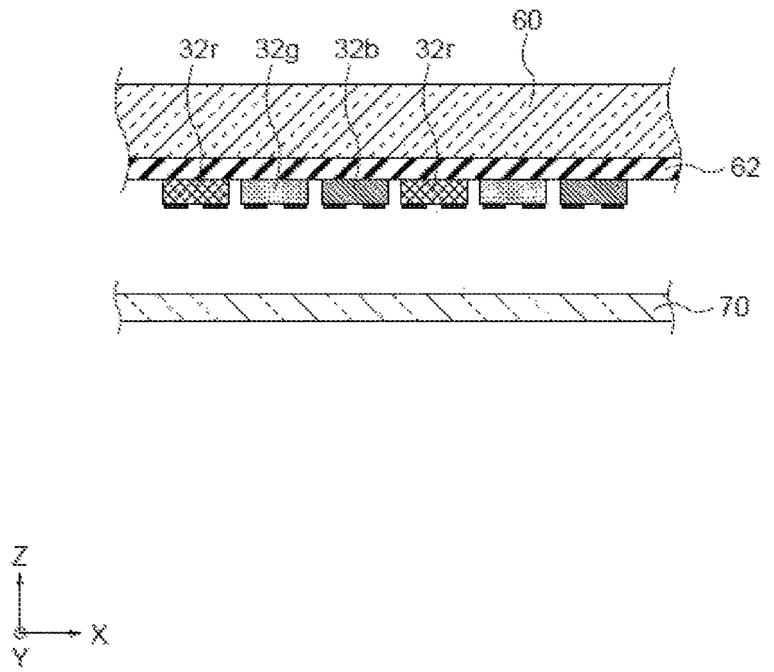
[FIG. 5F]
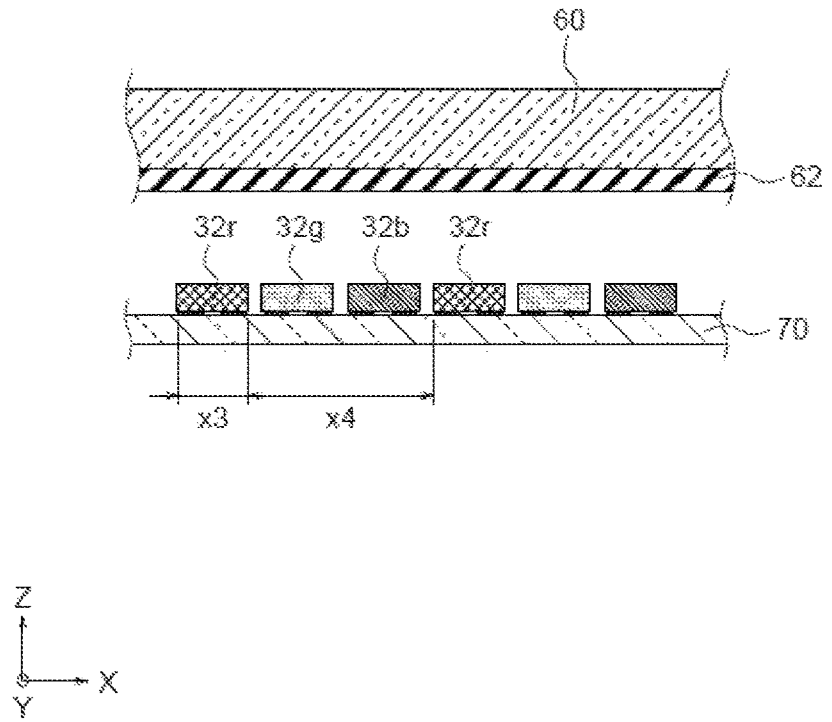

[FIG. 6A]
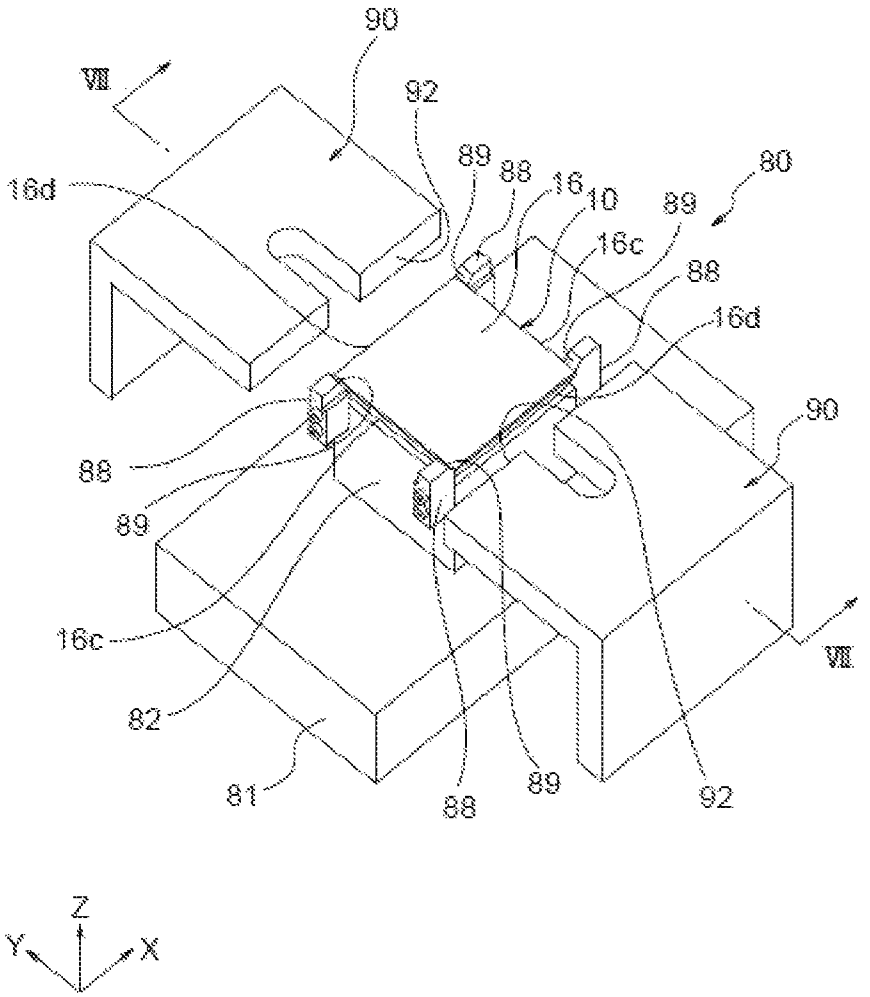

[FIG. 6B]
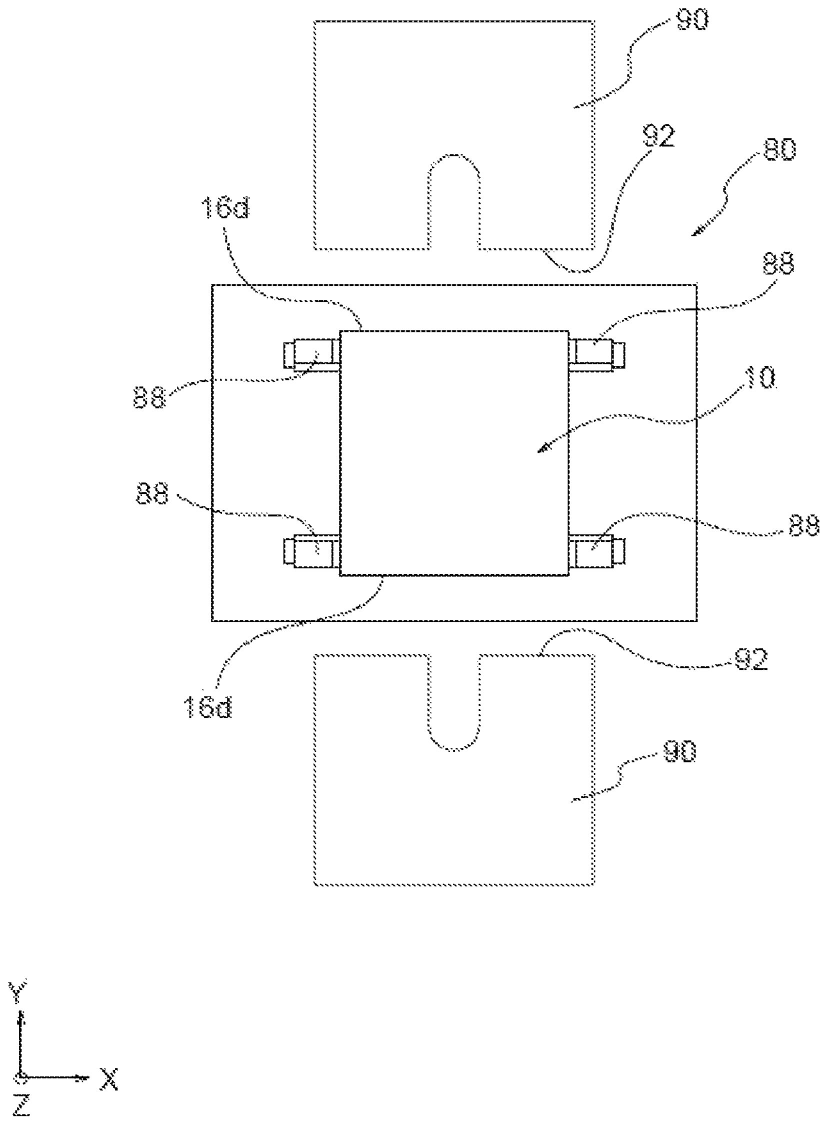

[FIG. 6C]
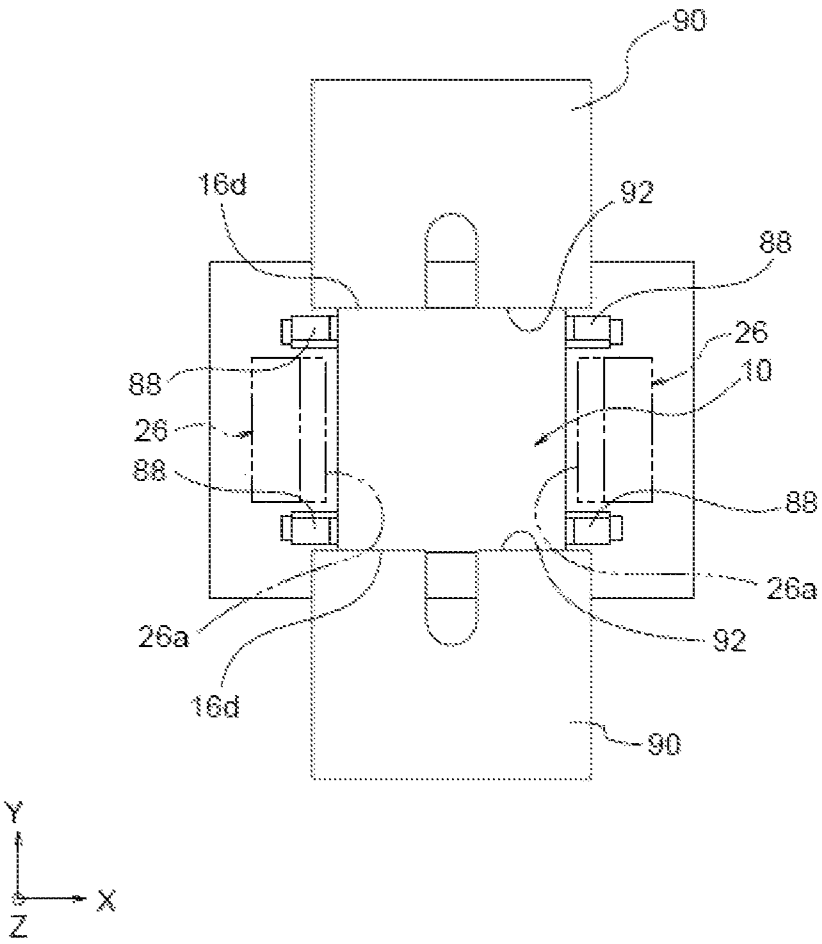

[FIG. 7]
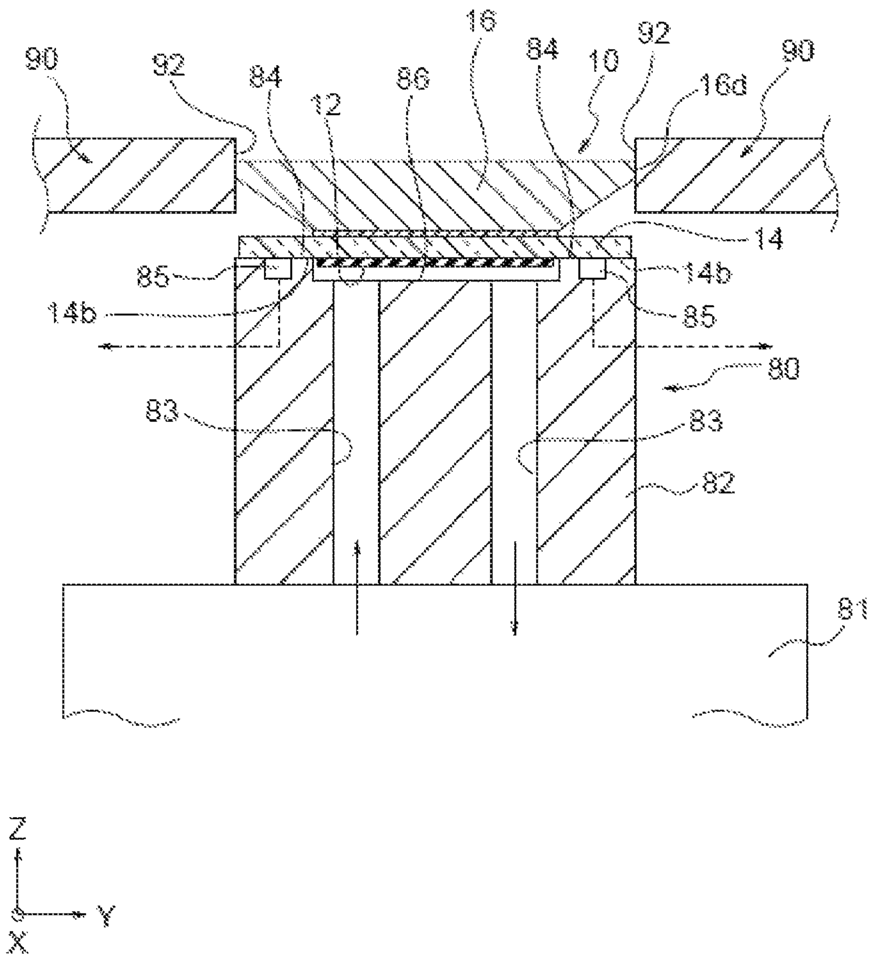

[FIG. 8]
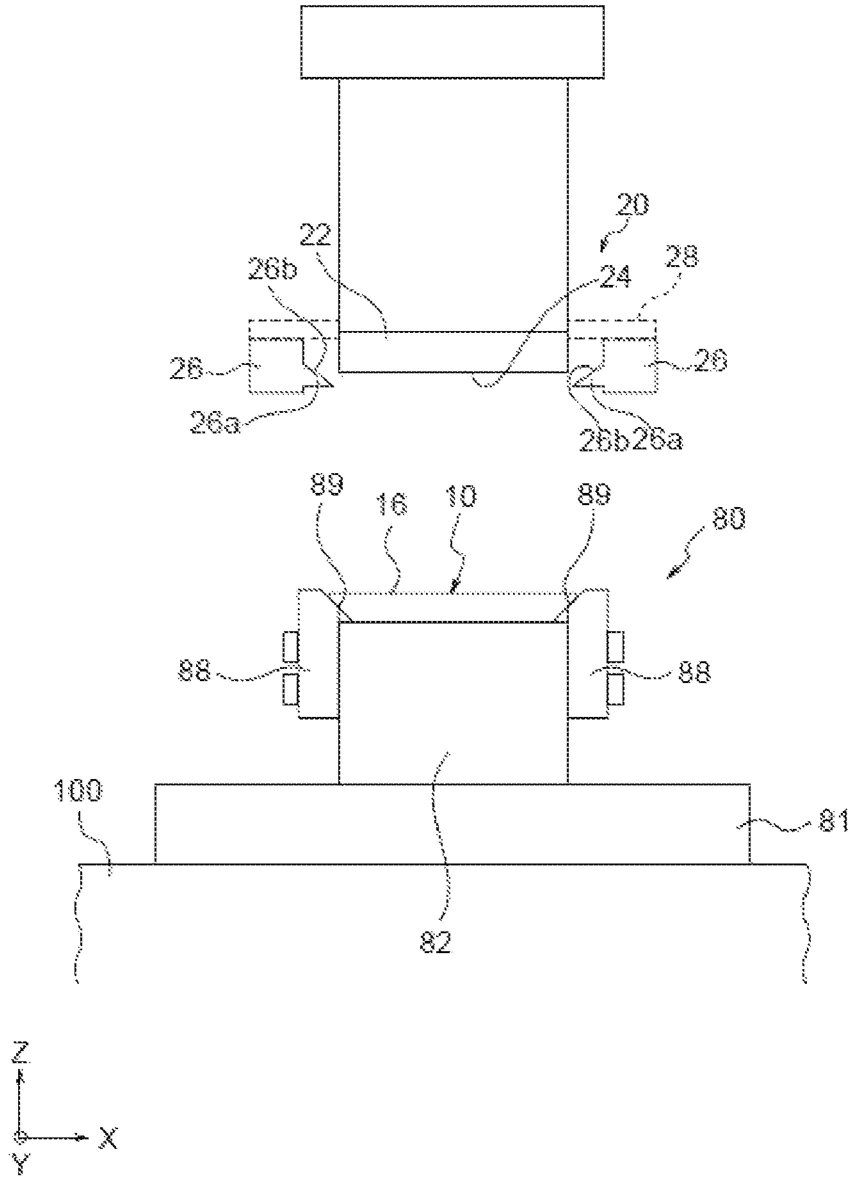

[FIG. 9]
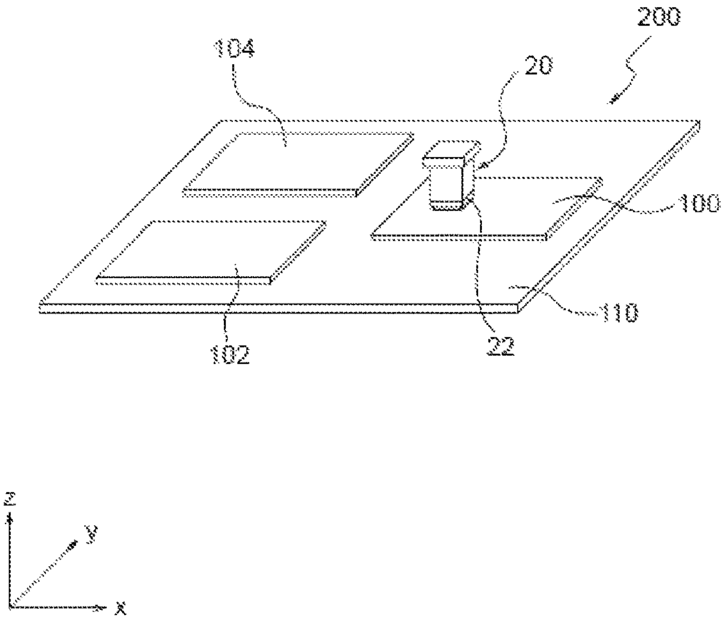
[FIG. 10]
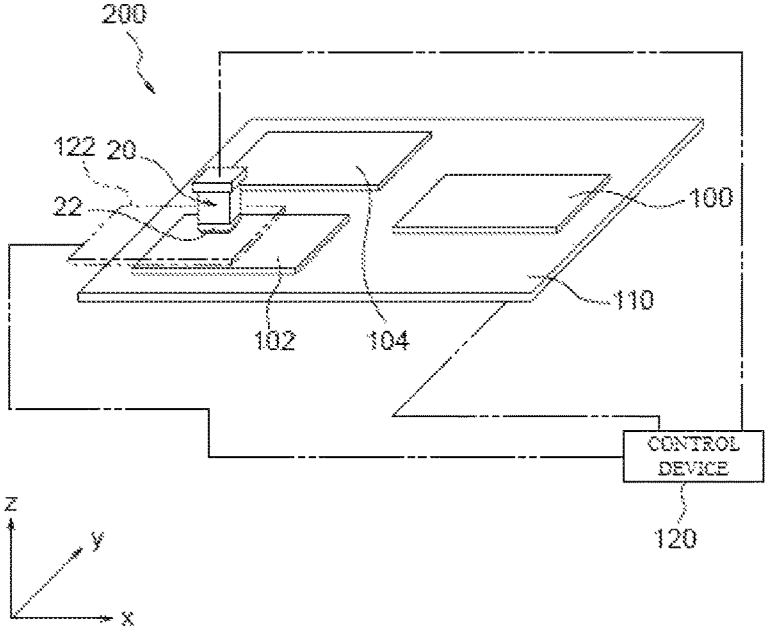

[FIG. 11]
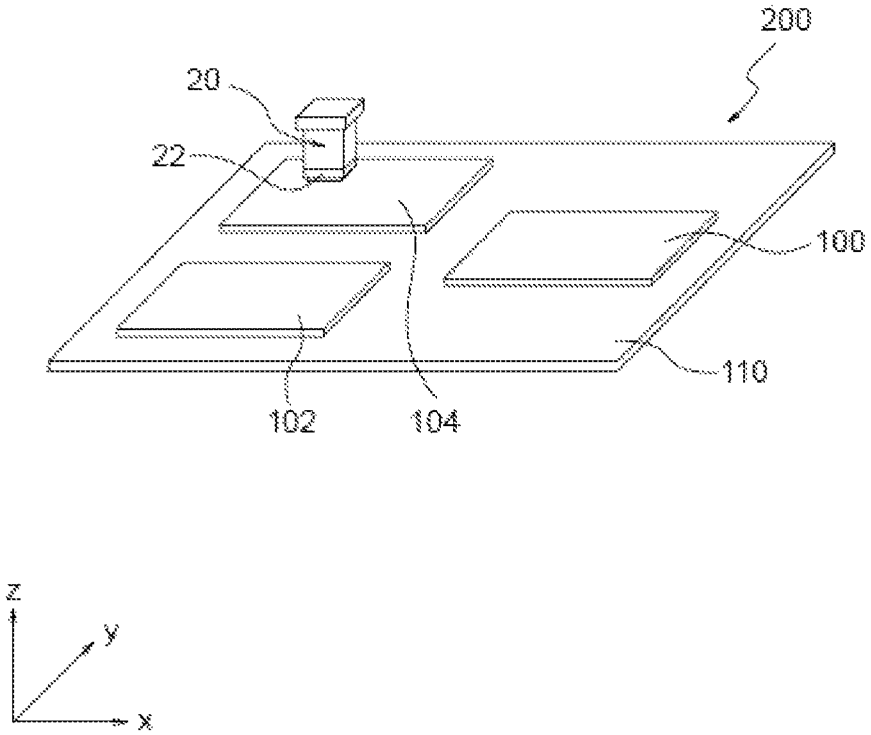

STAMP TOOL HOLDING APPARATUS, STAMP TOOL POSITIONING APPARATUS, MULTI-COMPONENT TRANSFER APPARATUS, AND METHOD FOR MANUFACTURING ELEMENT ARRAY

TECHNICAL FIELD

The present invention relates to a stamp tool holding device, a stamp tool positioning device, a multi-element transfer device, and a method of manufacturing an element array.

BACKGROUND ART

In transport of an extremely small part, use of a stamp-shaped transport tool (stamp tool) having a large number of projections on a surface thereof has been studied. Patent Document 1 below discloses an example of the stamp-shaped transport tool. Conventionally, a stamp tool for allowing detachment of an object to be transported by a coefficient of thermal expansion has been disclosed.

An LED element referred to as a mini-LED or a micro-LED is an example of an extremely small part assumed to be an object to be transported of a stamp tool. The mini-LED or the micro-LED has a width of 1 to 8 μm, a length of 5 to 10 μm, and height of 0.5 to 3 μm, which are extremely smaller than those of a conventional general LED element.

As in a conventional art, an LED display is manufactured by picking up elements from a wafer on which a plurality of such LED elements is disposed and transporting the elements to a substrate corresponding to a display. However, there is a desire for a device and method for efficiently transferring a transport object element such as an element using the stamp tool.

[Patent Document 1] US 2017/0173852 A1

SUMMARY

The present invention has been made in view of such actual circumstances, and an object thereof is to provide a stamp tool holding device capable of holding a stamp tool while keeping a stamp surface of the stamp tool clean, a stamp tool positioning device that easily positions a stamp tool with respect to a transport head, a multi-element transfer device for efficiently transferring a transport object element such as an element using a stamp tool, and a method of manufacturing an element array using the same.

To achieve the above-mentioned object, a stamp tool holding device according to the present invention is a stamp tool holding device including an installation stage for a stamp tool including a stamp layer having a portion allowed to detachably adhere to a transport object element to be detachably installed on the installation stage, in which the installation stage has an installation surface on which a housing recess for accommodating the stamp layer is formed, and a suction hole capable of detachably adsorbing a part of the stamp tool located around the stamp layer is formed on the installation surface.

In the stamp tool holding device according to the present invention, by introducing a negative pressure into the suction hole in a state where the stamp layer is accommodated inside the housing recess, a part of the stamp tool is detachably adsorbed to the installation surface. As a result, the inside of the housing recess is sealed, dirt, dust, etc. are less likely to adhere to the stamp surface of the stamp layer accommodated inside the housing recess, and the stamp tool may be installed while keeping the stamp surface clean.

Preferably, the installation stage is detachably fixed to a base. The stamp tool needs to be replaced according to a request from a customer, the substrate (the substrate may be a sheet/which is similarly applied hereinafter) on which the element serving as the transport object element is built, etc. By preparing a plurality of installation stages according to a change of the stamp tool, the base does not need to be replaced, and by exchanging only the installation stage, a size change of the stamp tool may be addressed. In addition, a degree of flatness of each installation stage with respect to the base is preferably ensured, and there is no need to adjust the degree of flatness when the stamp tool is replaced.

Preferably, a gas flow hole for communicating with a space inside the housing recess to replace gas inside the housing recess is formed in the installation stage. By replacing gas in the recess, dirt, dust, etc. adhering to the surface of the stamp layer accommodated inside the housing recess can be discharged together with the gas, and a degree of cleanliness of the stamp layer can be improved.

A guide means is provided on an upper part of the installation stage at least along a first axis so that the stamp layer of the stamp tool drops into the housing recess. By providing the guide means on the installation stage, rough positioning of the stamp tool at least along the first axis (a second axis may be included) is facilitated. In addition, when the stamp tool is picked up by the transport head, positioning of the stamp tool with respect to the transport head is facilitated.

Preferably, the guide means includes guide members detachably provide on both sides of the installation stage along the first axis, and an inclined surface allowed to be engaged with a tapered surface of the stamp tool is formed on each of the guide members. With such a configuration, rough positioning of the stamp tool at least along the first axis (the second axis may be included) is further facilitated. In addition, when the stamp tool is picked up by the transport head, positioning of the stamp tool with respect to the transport head is further facilitated.

Preferably, at least two guide members are provided on each of the both sides of the installation stage along the first axis, and a claw portion of a chuck mechanism (also referred to as a clamping mechanism/which is similarly applied hereinafter) is insertable along a gap between the two guide members. With such a configuration, accurate positioning of the stamp tool may be performed at least along the first axis (the second axis may be included). In addition, when the stamp tool is picked up by the transport head, positioning (particularly positioning along the first axis) of the stamp tool with respect to the transport head becomes more accurate.

Preferably, the stamp tool holding device further includes a pair of positioning members disposed on both sides of the installation stage along a second axis direction and allowed to move to come into contact with and be separated from edge portions of the stamp tool installed on the upper part of the installation stage. Such a configuration enables high-accurate positioning of the stamp tool along the second axis in addition to the first axis. In addition, when the stamp tool is picked up by the transport head, positioning of the stamp tool with respect to the transport head is further facilitated.

A method of manufacturing an element array according to a first aspect of the present invention includes

- picking up a stamp tool held by the stamp tool holding device according to any one of the above descriptions using a transport head, and taking out transport object elements simultaneously from a substrate and transporting using the stamp tool attached on the transport head.

In the method of manufacturing the element array according to the first aspect of the present invention, the element array having the plurality of elements may be easily manufactured in a short time and at a low cost.

A method of manufacturing an element array according to a second aspect of the present invention includes preparing stamp tool holding devices according to any one of the above descriptions, the number of which is equal to or greater than the number of substrates, on which each of substrates a plurality of types of elements serving as the transport object element, installing a stamp tool prepared for each of the plurality of types of elements on each of the stamp tool holding devices, picking up the stamp tool held by each of the stamp tool holding devices corresponding to each of the substrates from the stamp tool holding device using a transport head, and taking out the elements simultaneously and transporting them using the stamp tool attached on the transport head from a substrate corresponding to the stamp tool picked up, and returning the stamp tool after the elements are taken out to a corresponding one of the stamp tool holding devices after elements are simultaneously taken out and transported.

In the method of manufacturing the element array according to the second aspect of the present embodiment, the element array in which the plurality of types of elements is arranged may be easily manufactured in a short time and at a low cost. Moreover, since the stamp tool used in accordance with each substrate corresponding to each of the plurality of types of elements is installed and stored in the dedicated stamp tool holding device, it is easy to maintain a degree of cleanliness of the stamp surface of each stamp tool at a high level while effectively preventing misalignment of the elements.

Preferably, the stamp tool includes a stamp layer having a portion allowed to detachably adhere to a transport object element to be detachably installed on the installation stage, a support plate, the stamp layer being fixed to the support plate, and an adapter plate having a mounting surface, the support plate being replaceably attached thereto, and a transport head being allowed to be detachably attached thereon.

In this stamp tool, only the support plate to which the stamp layer is fixed can be replaced from the adapter plate without replacing the entire stamp tool. Therefore, it becomes easier to prepare stamp tool having different types of stamp layers at a low cost. In addition, even when the size of the stamp layer or the size of the support plate is changed, it becomes easy to unify the size of the adapter plate, and it becomes easy to share the transport head or an installation stage. In addition, since the stamp layer is fixed to the support plate, it is easy to ensure a degree of flatness of the stamp surface of the stamp layer.

Preferably, the support plate is replaceably attached to the adapter plate by an adhesive layer. By using the adhesive layer, the support plate can be easily replaceably attached to the adapter plate, and the degree of flatness of the support plate, that is, the degree of flatness of the stamp surface of the stamp layer can be easily ensured.

Preferably, the transport object element is a plurality of elements formed on a surface of a substrate, a plurality of projections corresponding to the elements is formed on the stamp layer, and the elements detachably adhere to the respective projections. With such a configuration, it becomes easy to take out a plurality of elements as a plurality of transport object elements from the substrate at the same time and transfer or mount the elements.

Preferably, the support plate has a glass plate or a ceramic plate having a flat surface. With such a configuration, it is easy to ensure the degree of flatness of the support plate, that is, the degree of flatness of the stamp surface of the stamp layer. In addition, in particular, when the support plate is made of a glass plate, it becomes easier to form an adsorbable surface around the stamp layer.

Preferably, a tapered surface having an outer diameter decreasing toward the support plate is formed on a side surface of the adapter plate. A claw portion of a clamping mechanism can be detachably engaged with the tapered surface formed on the side surface of the adapter plate. In addition, a mounting force of the stamp tool to the transport head by the clamping mechanism can be increased. Further, positioning of the stamp tool is facilitated along an inclined surface of a guide member installed in an upper part of the installation stage for the stamp tool.

Preferably, a maximum width of the adapter plate is set to be larger than a width of the support plate. With such a configuration, engagement between the inclined surface of the guide member and the tapered surface of the stamp tool is facilitated.

Preferably, an insertable surface facing the tapered surface of the adapter plate is present on a surface of the support plate on a side of the adapter plate. The presence of the insertable surface on the support plate of the stamp tool facilitates detachable engagement of the claw portion of the clamping mechanism with the tapered surface on the side surface of the adapter plate.

Preferably, an adsorbable surface is formed around the stamp layer on a surface of the support plate on a side of the stamp layer. When the adsorbable surface is present on the support plate of the stamp tool, the support plate can be adsorbed to an installation surface of the installation stage for the stamp tool, which facilitates sealing and holding of the stamp layer inside the housing recess. The stamp layer in the housing recess is kept clean.

A shim plate for adjusting a degree of parallelism (a degree of flatness) of the support plate may be interposed between the stamp layer and the adapter plate. With such a configuration, the degree of flatness of the support plate is improved, and the degree of flatness of the stamp surface is improved.

A method of manufacturing an element array according to a third aspect the present invention includes simultaneously taking out and transporting a plurality of transport object elements from a substrate using any one of the above-described the stamp tools. In the method of manufacturing an element array according to the present invention, the element array having the plurality of elements can be easily manufactured in a short time and at a low cost.

In addition, to achieve the above-mentioned object, a stamp tool positioning device according to the present invention includes an installation stage, a stamp tool having a stamp layer having a portion being detachably installed on the installation stage, a transport object element being allowed to detachably adhere to the portion, a transport head capable of picking up the stamp tool installed on the installation stage,

- a first axis positioning mechanism configured to position and adjust a relative position of the stamp tool with respect to the transport head along a first axis, and
- a second axis positioning mechanism configured to position and adjust a relative position of the stamp tool with respect to the installation stage along a second axis intersecting the first axis.

When it is presumed that all positioning of the stamp tool along the first axis and the second axis is performed with respect to the transport head, a positioning mechanism with respect to the transport head becomes complicated. As a result, driving control of the transport head becomes complicated, and the transport position accuracy of the transport head may deteriorate. In addition, when it is presumed that all positioning of the stamp tool along the first axis and the second axis is performed with respect to the installation stage, the positioning mechanism on the installation stage may become complicated, a required for the installation stage may become large, and movement control of the installation stage becomes difficult. Further, positioning between the installation stage and the transport head becomes complicated.

In the stamp tool positioning device of the present invention, positioning of the stamp tool along the second axis may be performed using the second axis positioning mechanism with respect to the installation stage, and positioning of the stamp tool along the first axis may be performed using the first axis positioning mechanism with respect to the transport head. Therefore, the positioning mechanism with respect to the transport head becomes simple and lightweight. As a result, driving control of the transport head is facilitated, and the transport position accuracy of the transport head is improved.

In addition, in the stamp tool positioning device of the present invention, positioning of the stamp tool along the second axis is performed with respect to the installation stage. However, accurate positioning of the stamp tool along the first axis is unnecessary. Therefore, the positioning mechanism on the installation stage is simplified, and the space required for the installation stage can be minimized. Therefore, movement control of the installation stage is facilitated. Further, positioning between the installation stage and the transport head may be performed with high accuracy only along the second axis, for example, and positioning along the first axis may be rough since positioning of the stamp tool along the first axis is performed by the first positioning mechanism with respect to the transport head.

Preferably, the first axis positioning mechanism additionally serves as a attaching means for detachably attaching the stamp tool on the transport head. Since the attaching means additionally serves as the positioning mechanism, there is no need to equip the transport head with a separate positioning mechanism as a part other than the attaching means.

In addition, even though the attaching means is not particularly limited, for example, a chuck mechanism (hereinafter also referred to as a "clamping mechanism"), etc. is illustrated. Chuck mechanisms are provided on mutually opposite sides of the transport head along the first axis, and are provided to be movable to come into contact with and be separated from the stamp tool.

Preferably, the second axis positioning mechanism includes at least a pair of second positioning members disposed on both sides of the installation stage along a direction of the second axis and allowed to move to come into contact with and be separated from the stamp tool installed on the installation stage.

With such a configuration, highly accurate positioning of the stamp tool along the second axis may be performed with respect to the installation stage. In addition, when the stamp tool is picked up by the transport head, positioning of the stamp tool with respect to the transport head is further facilitated.

Preferably, the installation stage has an installation surface on which a housing recess for accommodating the stamp layer is formed, and a suction hole capable of detachably adsorbing a part of the stamp tool located around the stamp layer is formed on the installation surface.

With such a configuration, by introducing a negative pressure into the suction hole in a state where the stamp layer is accommodated inside the housing recess, a part of the stamp tool is detachably adsorbed to the installation surface. As a result, the inside of the housing recess is sealed, dirt, dust, etc. are less likely to adhere to the stamp surface of the stamp layer accommodated inside the housing recess, and the stamp tool may be installed while keeping the stamp surface clean.

Preferably, the installation stage is detachably fixed to a base. The stamp tool needs to be replaced according to a request from a customer, the substrate (the substrate may be a sheet/which is similarly applied hereinafter) on which the element serving as the transport object element is built, etc. By preparing a plurality of installation stages according to a change of the stamp tool, the base does not need to be replaced, and by exchanging only the installation stage, a size change of the stamp tool may be addressed. In addition, a degree of flatness of each installation stage with respect to the base is preferably ensured, and there is no need to adjust the degree of flatness when the stamp tool is replaced.

Preferably, a gas flow hole for communicating with a space inside the housing recess to replace gas inside the housing recess is formed in the installation stage. By replacing gas in the recess, dirt, dust, etc. adhering to the surface of the stamp layer accommodated inside the housing recess can be discharged together with the gas, and a degree of cleanliness of the stamp layer can be improved.

Preferably, a guide means for guiding the stamp tool at least along a first axis is attached on the installation stage. By providing the guide means on the installation stage, rough positioning of the stamp tool at least along the first axis is facilitated. In addition, when the stamp tool is picked up by the transport head, highly accurate positioning of the stamp tool along the first axis with respect to the transport head is facilitated.

Preferably, the guide means includes a plurality of guide members detachably attached on both sides of the installation stage along the first axis. Preferably, an inclined surface allowed to be engaged with a tapered surface of the stamp tool is formed on each of the guide members. With such a configuration, rough positioning of the stamp tool at least along the first axis is further facilitated.

Preferably, at least two guide members are attached on each of the both sides of the installation stage along the first axis, and the first axis positioning mechanism is allowed to be in contact with the stamp tool by being inserted along a gap between the two guide members. With such a configuration, highly accurate positioning of the stamp tool with respect to the transport head becomes easy while having a simple configuration.

A method of manufacturing an element array of the present invention includes

- transporting a stamp tool positioned by the stamp tool positioning device according to any one of the above descriptions using a transport head, and taking out transport object elements simultaneously from a substrate and transporting them using the stamp tool attached on the transport head.

In the method of manufacturing the element array of the present invention, an element array having a plurality of elements positioned and arranged with high accuracy can be easily manufactured in a short time and at a low cost.

Preferably, the stamp tool includes a stamp layer having a portion allowing a transport object element to detachably adhere thereto, a support plate, the stamp layer being fixed to the support plate, and an adapter plate having a mounting surface, the support plate being replaceably attached thereto, and a transport head being allowed to be detachably attached thereon.

In this stamp tool, only the support plate to which the stamp layer is fixed can be replaced from the adapter plate without replacing the entire stamp tool. Therefore, it becomes easier to prepare stamp tool having different types of stamp layers at a low cost. In addition, even when the size of the stamp layer or the size of the support plate is changed, it becomes easy to unify the size of the adapter plate, and it becomes easy to share the transport head or an installation stage. In addition, since the stamp layer is fixed to the support plate, it is easy to ensure a degree of flatness of the stamp surface of the stamp layer.

Preferably, the support plate is replaceably attached to the adapter plate by an adhesive layer. By using the adhesive layer, the support plate can be easily replaceably attached to the adapter plate, and the degree of flatness of the support plate, that is, the degree of flatness of the stamp surface of the stamp layer can be easily ensured.

Preferably, the transport object element is a plurality of elements formed on a surface of a substrate, a plurality of projections corresponding to the elements is formed on the stamp layer, and the elements detachably adhere to the respective projections. With such a configuration, it becomes easy to take out a plurality of elements as a plurality of transport object elements from the substrate at the same time and transfer or mount the elements.

Preferably, the support plate has a glass plate or a ceramic plate having a flat surface. With such a configuration, it is easy to ensure the degree of flatness of the support plate, that is, the degree of flatness of the stamp surface of the stamp layer. In addition, in particular, when the support plate is made of a glass plate, it becomes easier to form an adsorbable surface around the stamp layer.

Preferably, a tapered surface having an outer diameter decreasing toward the support plate is formed on a side surface of the adapter plate. A claw portion of a clamping mechanism can be detachably engaged with the tapered surface formed on the side surface of the adapter plate. In addition, a mounting force of the stamp tool to the transport head by the clamping mechanism can be increased. Further, positioning of the stamp tool is facilitated along an inclined surface of a guide member installed in an upper part of the installation stage for the stamp tool.

Preferably, a maximum width of the adapter plate is set to be larger than a width of the support plate. With such a configuration, engagement between the inclined surface of the guide member and the tapered surface of the stamp tool is facilitated.

Preferably, an insertable surface facing the tapered surface of the adapter plate is present on a surface of the support plate on a side of the adapter plate. The presence of the insertable surface on the support plate of the stamp tool facilitates detachable engagement of the claw portion of the clamping mechanism with the tapered surface on the side surface of the adapter plate.

Preferably, an adsorbable surface is formed around the stamp layer on a surface of the support plate on a side of the stamp layer. When the adsorbable surface is present on the support plate of the stamp tool, the support plate can be adsorbed to an installation surface of the installation stage for the stamp tool, which facilitates sealing and holding of the stamp layer inside the housing recess. The stamp layer in the housing recess is kept clean.

A shim plate for adjusting a degree of parallelism (a degree of flatness) of the support plate may be interposed between the stamp layer and the adapter plate. With such a configuration, the degree of flatness of the support plate is improved, and the degree of flatness of the stamp surface is improved.

In addition, to achieve the above-mentioned object, a multi-element transfer device according to the present invention includes a stamp table, at least one stamp tool including a stamp layer having a portion allowed to detachably adhere to transport object elements be detachably installed on the stamp table, a transport head capable of picking up the at least one stamp tool installed on the stamp table, a first table on which a first substrate having the transport object elements on a surface of the first substrate is detachably fixed, and a second table on which a second substrate having a surface is detachably fixed, the transport object elements disposed on the first substrate being transported by the stamp tool and moved to the surface of the second substrate, in which the stamp table and the first table are disposed along a first axis, the first table and the second table are disposed along a second axis intersecting the first axis, the transport head is movable relative to at least the stamp table along a third axis intersecting both the first axis and the second axis, the stamp tool has a mounting surface to which the transport head is detachably attached on an opposite side from the stamp layer, the stamp tool is attached to the stamp table so that the mounting surface faces upward along the third axis, the first table and the second table are movable relative to the transport head along at least the second axis, and the stamp table is movable relative to the transport head along at least the first axis.

In the multi-element transfer device according to the present invention, the stamp tool is attached to the stamp table so that the mounting surface faces upward along the third axis, the first table and the second table are movable relative to the transport head at least along the second axis, and the stamp table is movable relative to the transport head at least along the first axis.

Therefore, the transport head can relatively move on the stamp table, the first table, and the second table. In addition, the stamp tool held by the transport head may be used to simultaneously transfer the plurality of transport object elements from the surface of the first substrate of the first table to the surface of the second substrate of the second table. In addition, the stamp tool after transferring the transport object elements from the first substrate to the second substrate is returned to the original stamp table using the transport head. As described above, in the multi-element transfer device of the present invention, the stamp tool may be used to efficiently transfer the transport object elements such as the elements.

In addition, when the transport object elements such as a plurality of types of elements are transferred from a plurality of first substrates corresponding thereto, respectively, to a single second substrate, the transport object elements may be transferred using a different stamp tool for each type. Therefore, it is easy to transfer different types of transport object elements to the single second substrate in a set arrangement. For example, it is easy to efficiently manufacture an element array having few pixel defects.

Preferably, the first substrate includes placement substrates, each of which has the transport object elements having mutually different types on each substrates,

- the second substrate is a single mounting substrate or a single transfer substrate, and
- the stamp table includes installation stages detachably holding stamp tools corresponding to the element placement substrates, respectively.

In addition, preferably, the multi-element transfer device further includes a control means configured to driving-control a positional relationship among the transport head, the first table, the second table, and the stamp table

- so that the transport head picks up the stamp tool corresponding to each of the plurality of element placement substrates from a corresponding one of the installation stages,
- takes out one type of the transport object elements from the corresponding element placement substrate using the stamp tool picked up, and
- transfers the transported elements taken out to the second substrate.

With such a configuration, when the transport object elements such as a plurality of types of elements are transferred from a plurality of element placement substrates corresponding thereto, respectively, to a single second substrate, the transport object elements may be transferred using a different stamp tool for each type. Therefore, it is easy to transfer different types of transport object elements to the single second substrate in a set arrangement. For example, it is easy to efficiently manufacture an element array having few pixel defects.

Preferably, the multi-element transfer device further includes an imaging means capable of performing simultaneous imaging in two directions, the imaging means being allowed to enter a space between a surface of the first substrate and the stamp layer of the stamp tool when the transport head holding the stamp tool is located on the first substrate,

- in which the imaging means simultaneously captures images of a stamp surface of the stamp layer and the surface of the first substrate.

Preferably, the multi-element transfer device further includes a fine adjustment mechanism configured to change a relative position between the transport head and the first substrate based on a detection signal captured by the imaging means. By adjusting the relative position between the transport head and the first substrate using the fine adjustment mechanism, accurate positioning between the stamp layer of the stamp tool and the transport object element disposed on the surface of the first substrate is performed, and a plurality of small-sized transport object elements may be held with high accuracy on the stamp surface of the stamp layer.

The fine adjustment mechanism may change a relative rotation angle of the transport head around the third axis based on the detection signal captured by the imaging means. With such a configuration, positioning between the stamp surface of the stamp layer and the transport object element disposed on the surface of the first substrate becomes more accurate.

Preferably, the multi-element transfer device includes

- a first axis positioning mechanism configured to position and adjust a relative position of the stamp tool with respect to the transport head along the first axis, and
- a second axis positioning mechanism configured to position and adjust a relative position of the stamp tool with respect to the stamp table along the second axis intersecting the first axis.

With such a configuration, positioning of the stamp tool along the second axis may be performed using the second axis positioning mechanism with respect to the stamp table, and positioning of the stamp tool along the first axis may be performed using the first axis positioning mechanism with respect to the transport head. Therefore, the positioning mechanism with respect to the transport head becomes simple and lightweight. As a result, driving control of the transport head is facilitated, and the transport position accuracy of the transport head is improved.

In addition, positioning of the stamp tool along the second axis is performed with respect to the stamp table. However, accurate positioning of the stamp tool along the first axis is unnecessary. Therefore, the positioning mechanism on the stamp table is simplified, and the space required for the stamp table can be minimized. Therefore, movement control of the stamp table is facilitated. Further, positioning between the stamp table and the transport head may be performed with high accuracy only along the second axis, for example, and positioning along the first axis may be rough since positioning of the stamp tool along the first axis is performed by the first positioning mechanism with respect to the transport head.

Preferably, the first axis positioning mechanism additionally serves as a attaching means for detachably mounting the stamp tool on the transport head. Since the attaching means additionally serves as the positioning mechanism, there is no need to equip the transport head with a separate positioning mechanism as a part other than the attaching means.

In addition, even though the attaching means is not particularly limited, for example, a chuck mechanism (clamping mechanism), etc. is illustrated. Chuck mechanisms are provided on mutually opposite sides of the transport head along the first axis, and are provided to be movable to come into contact with and be separated from the stamp tool.

Preferably, the second axis positioning mechanism includes at least a pair of second positioning members disposed on both sides of the installation stage fixed to the stamp table along a direction of the second axis and allowed to move to come into contact with and be separated from the stamp tool installed on the installation stage.

With such a configuration, highly accurate positioning of the stamp tool along the second axis may be performed with respect to the installation stage. In addition, when the stamp tool is picked up by the transport head, positioning of the stamp tool with respect to the transport head is further facilitated.

Preferably, the installation stage has an installation surface on which a housing recess for accommodating the stamp layer is formed, and a suction hole capable of detachably adsorbing a part of the stamp tool located around the stamp layer is formed on the installation surface.

With such a configuration, by introducing a negative pressure into the suction hole in a state where the stamp layer is accommodated inside the housing recess, a part of the stamp tool is detachably adsorbed to the installation surface. As a result, the inside of the housing recess is sealed, dirt, dust, etc. are less likely to adhere to the stamp surface of the stamp layer accommodated inside the housing recess, and the stamp tool may be installed while keeping the stamp surface clean.

Preferably, the installation stage is detachably fixed to a base fixed to the stamp table. The stamp tool needs to be replaced according to a request from a customer, the substrate on which the element serving as the transport object element is built, etc. By preparing a plurality of installation stages according to a change of the stamp tool, the base does not need to be replaced, and by exchanging only the installation stage, a size change of the stamp tool may be addressed. In addition, a degree of flatness of each installation stage with respect to the base is preferably ensured, and there is no need to adjust the degree of flatness when the stamp tool is replaced.

Preferably, a gas flow hole for communicating with a space inside the housing recess to replace gas inside the housing recess is formed in the installation stage. By replacing gas in the recess, dirt, dust, etc. adhering to the surface of the stamp layer accommodated inside the housing recess can be discharged together with the gas, and a degree of cleanliness of the stamp layer can be improved.

Preferably, a guide means for guiding the stamp tool at least along a first axis is attached on the installation stage. By providing the guide means on the installation stage, rough positioning of the stamp tool at least along the first axis is facilitated. In addition, when the stamp tool is picked up by the transport head, highly accurate positioning of the stamp tool along the first axis with respect to the transport head is facilitated.

Preferably, the guide means includes a plurality of guide members detachably attached on both sides of the installation stage along the first axis. Preferably, an inclined surface allowed to be engaged with a tapered surface of the stamp tool is formed on each of the guide members. With such a configuration, rough positioning of the stamp tool at least along the first axis is further facilitated.

Preferably, at least two guide members are attached on each of the both sides of the installation stage along the first axis, and the first axis positioning mechanism is allowed to be in contact with the stamp tool by being inserted along a gap between the two guide members. With such a configuration, highly accurate positioning of the stamp tool with respect to the transport head becomes easy while having a simple configuration.

A method of manufacturing an element array of the present invention is characterized by taking out transport object elements simultaneously from a substrate using the multi-element transfer device according to any one of the above descriptions, and manufacturing the element array.

In the method of manufacturing the element array of the present invention, the element array having the plurality of elements positioned and arranged with high accuracy may be easily manufactured in a short time and at a low cost.

Preferably, the stamp tool includes a stamp layer having a portion allowing a transport object element to detachably adhere thereto, a support plate, the stamp layer being fixed to the support plate, and an adapter plate having a mounting surface, the support plate being replaceably attached thereto, and a transport head being allowed to be detachably attached thereon.

In this stamp tool, only the support plate to which the stamp layer is fixed can be replaced from the adapter plate without replacing the entire stamp tool. Therefore, it becomes easier to prepare stamp tool having different types of stamp layers at a low cost. In addition, even when the size of the stamp layer or the size of the support plate is changed, it becomes easy to unify the size of the adapter plate, and it becomes easy to share the transport head or an installation stage. In addition, since the stamp layer is fixed to the support plate, it is easy to ensure a degree of flatness of the stamp surface of the stamp layer.

Preferably, the support plate is replaceably attached to the adapter plate by an adhesive layer. By using the adhesive layer, the support plate can be easily replaceably attached to the adapter plate, and the degree of flatness of the support plate, that is, the degree of flatness of the stamp surface of the stamp layer can be easily ensured.

Preferably, the transport object element is a plurality of elements formed on a surface of a substrate, a plurality of projections corresponding to the elements is formed on the stamp layer, and the elements detachably adhere to the respective projections. With such a configuration, it becomes easy to take out a plurality of elements as a plurality of transport object elements from the substrate at the same time and transfer or mount the elements.

Preferably, the support plate has a glass plate or a ceramic plate having a flat surface. With such a configuration, it is easy to ensure the degree of flatness of the support plate, that is, the degree of flatness of the stamp surface of the stamp layer. In addition, in particular, when the support plate is made of a glass plate, it becomes easier to form an adsorbable surface around the stamp layer.

Preferably, a tapered surface having an outer diameter decreasing toward the support plate is formed on a side surface of the adapter plate. A claw portion of a clamping mechanism (chuck mechanism) can be detachably engaged with the tapered surface formed on the side surface of the adapter plate. In addition, a mounting force of the stamp tool to the transport head by the clamping mechanism can be increased. Further, positioning of the stamp tool is facilitated along an inclined surface of a guide member installed in an upper part of the installation stage for the stamp tool.

Preferably, a maximum width of the adapter plate is set to be larger than a width of the support plate. With such a configuration, engagement between the inclined surface of the guide member and the tapered surface of the stamp tool is facilitated.

Preferably, an insertable surface facing the tapered surface of the adapter plate is present on a surface of the support plate on a side of the adapter plate. The presence of the insertable surface on the support plate of the stamp tool facilitates detachable engagement of the claw portion of the clamping mechanism with the tapered surface on the side surface of the adapter plate.

Preferably, an adsorbable surface is formed around the stamp layer on a surface of the support plate on a side of the stamp layer. When the adsorbable surface is present on the support plate of the stamp tool, the support plate can be adsorbed to an installation surface of the installation stage for the stamp tool, which facilitates sealing and holding of the stamp layer inside the housing recess. The stamp layer in the housing recess is kept clean.

A shim plate for adjusting a degree of parallelism (a degree of flatness) of the support plate may be interposed between the stamp layer and the adapter plate. With such a configuration, the degree of flatness of the support plate is improved, and the degree of flatness of the stamp surface is improved.

BRIEF DESCRIPTION OF THE DRAWINGS

FIG. 1A is a schematic front view and a main part enlarged view of a stamp tool according to an embodiment of the present invention;

FIG. 1B is a schematic front view of a stamp tool according to another embodiment of the present invention;

FIG. 1C is a schematic plan view of a modification of the stamp tool of FIG. 1B;

FIG. 1D is a cross-sectional view of the stamp tool taken along ID-ID illustrated in FIG. 1C;

FIG. 1E is a cross-sectional view of the stamp tool taken along IE-IE illustrated in FIG. 1C;

FIG. 2A is a schematic diagram of a transport device including a transport head that detachably transports the stamp tool illustrated in FIG. 1A;

FIG. 2B is a schematic diagram of a transport device illustrating a state in which the stamp tool is gripped by the transport head illustrated in FIG. 2A;

FIG. 3A is a schematic diagram of a transport device illustrating a state before picking up an element from a semiconductor substrate;

FIG. 3B is a schematic diagram of the transport device illustrating a state of pressing a stamp layer of the stamp tool against the element on the semiconductor substrate from the state illustrated in FIG. 3A;

FIG. 3C is a schematic diagram of the transport device illustrating a state after picking up the element from the semiconductor substrate;

FIG. 4A is a partial schematic diagram illustrating details of a claw portion of a clamping mechanism used in a transport device according to another embodiment of the present invention;

FIG. 4B is a partial schematic diagram illustrating details of a claw portion of the clamping mechanism used in the transport device according to the other embodiment of the present invention;

FIG. 5A is a schematic cross-sectional view of the element formed on the semiconductor substrate;

FIG. 5B is a schematic cross-sectional view illustrating a state in which the element on the semiconductor substrate is picked up by the stamp tool of the transport device;

FIG. 5C1 is a schematic cross-sectional view illustrating a state in which the element on the semiconductor substrate is picked up by the stamp tool of the transport device and then disposed on a mounting substrate (sheet);

FIG. 5C2 is a schematic cross-sectional view illustrating a state in which the element on the semiconductor substrate is picked up by the stamp tool of the transport device and then disposed on a first transfer substrate (sheet);

FIG. 5D is a schematic cross-sectional view illustrating a state in which an element array disposed on the first transfer substrate (sheet) is transferred to a second transfer substrate (sheet);

FIG. 5E is a schematic cross-sectional view illustrating a state before the element array disposed on the second transfer substrate (sheet) is transferred to the mounting substrate (sheet);

FIG. 5F is a schematic cross-sectional view illustrating a state after the element array disposed on the second transfer substrate (sheet) is transferred to the mounting substrate (sheet);

FIG. 6A is a schematic perspective view of a stamp stage on which the stamp tool illustrated in FIG. 1A is installed;

FIG. 6B is a plan view of the stamp stage illustrated in FIG. 6A, and illustrates a state in which a positioning member is open;

FIG. 6C is a plan view of the stamp stage illustrated in FIG. 6A, and illustrates a state in which the positioning member is closed;

FIG. 7 is a schematic cross-sectional view of the stamp stage taken along line VII-VII illustrated in FIG. 6A;

FIG. 8 is a side view obtained by adding the transport head illustrated in FIG. 2A to a side view of the stamp stage illustrated in FIG. 6A when viewed in a Y-axis direction;

FIG. 9 is a schematic view illustrating a relationship among a stamp table on which the stamp stage illustrated in FIG. 6A is disposed, an element table on which an element forming substrate illustrated in FIG. 5A is disposed, a mounting table on which the mounting substrate illustrated in FIG. 5C1 is disposed, and the transport head;

FIG. 10 is a schematic view illustrating a state in which relative positions of the transport head and the tables are changed from a state illustrated in FIG. 9; and FIG. 11 is a schematic view illustrating a state in which the relative positions of the transport head and the tables are changed from a state illustrated in FIG. 10.

DETAILED DESCRIPTION

Hereinafter, the present invention will be described based on embodiments illustrated in the drawings.

First Embodiment

As illustrated in FIGS. 9 to 11, a multi-element transfer device 200 includes a transport device 20, a stamp table 100, an element table 102 serving as a first table, and a mounting table 104 serving as a second table. As illustrated in FIG. 2A, the transport device 20 has a transport head 22 that detachably transports the stamp tool 10.

(Stamp Tool)

First, the stamp tool 10 will be mainly described. As illustrated in FIG. 1A, the stamp tool 10 includes a stamp layer 12, a support plate 14, and an adapter plate 16.

On the stamp layer 12, projections 11 protruding downward along a Z-axis are formed in a matrix at predetermined intervals in an X-axis direction and a Y-axis direction. For example, an X-axis direction width x1 of the projections 11 and an X-axis direction interval x2 of adjacent projections 11 are determined according to an X-axis direction width x3, an X-axis direction interval x4, etc. of elements (an example of a transport object element) **32*r* for red light emission mounted on a surface of a mounting substrate (hereinafter the substrate may be a sheet) illustrated in FIG. 5**F.

Note that although not illustrated in FIG. 1A, the above description is similarly applied to a Y-axis direction width of the projections 11 and a Y-axis direction interval of adjacent projections 11. The projections 11 are disposed in a matrix on a lower surface of the stamp layer 12, and the number of projections disposed is not particularly limited, and is one to several hundred thousand.

In the present embodiment, in the drawings, an X-axis (first axis), a Y-axis (second axis), and the Z-axis (third axis) are substantially perpendicular to one another, the X-axis and Y-axis are parallel to a planar direction of the stamp layer 12, and the Z-axis is parallel to a direction in which the projections 11 protrude.

As illustrated in FIG. 1A, a protrusion height z1 of the projections 11 of the stamp layer 12 is determined in relation to a Z-axis direction height z2 of the elements 32*r* illustrated in FIG. 5B, and is preferably, for example, 1 to 8 times the Z-axis direction height z2. A Z-axis direction thickness z3 of the stamp layer 12 is not particularly limited, and is preferably about 0.25 times or more the protrusion height z1 of the projections 11. Note that the X-axis direction width x3 (the Y-axis direction width is about the same) of the elements 32*r* is, for example, 1 to 150 μm, and the height z2 is, for example, 1 to 150 μm.

The stamp layer 12 and the projections 11 may be made of different materials as long as the stamp layer 12 and the projections 11 are strongly bonded, or may be made of the same material. By using the same material, a possibility that the projections 11 will be peeled from the stamp layer 12 is reduced. At least the projections 11 are made of an adhesive material, and are configured to allow the elements 32*r* disposed with a predetermined fixing force F1 on an element forming substrate 30 illustrated in FIG. 5B to adhere thereto with predetermined adhesion force F2. The material and shape of the projections 11 are determined so that, when a lower end of a projection 11 is pressed against an upper surface of an element 32*r* with a predetermined force, the adhesion force F2 of the projection 11 with respect to the element 32*r* becomes greater than the fixing force F1 of the element 32*r* with respect to the substrate 30.

The material of the projections 11 is not particularly limited, and examples thereof include polydimethylsiloxane (PDMS), organosilicon compounds, and viscoelastic elastomer such as polyether rubber. The stamp layer 12 may be made of the same material as that of the projections 11, and a surface of the stamp layer 12 other than the projections 11 is preferably non-adhesive. It is preferable not to pick up the elements 32*r* by adhesion except for the projections 11.

As illustrated in FIG. 1A, the stamp layer 12 is fixed to support plate 14. The support plate 14 is made of a material having higher rigidity and a superior degree of flatness than the stamp layer 12, and is preferably made of a glass plate, a metal plate, a ceramic plate, etc. A thickness of the support plate 14 is not particularly limited, and is preferably 0.5 mm or more.

The stamp layer 12 may be formed directly on a surface of the support plate 14, or may be fixed by an adhesive layer. In any case, the stamp layer 12 is fixed to the surface of the support plate 14 with a sticking force sufficiently higher than the adhesion force F2 illustrated in FIG. 5B. In a post-process, the element 32*r* is peeled off from the projection 11 and disposed on, for example, a mounting substrate 70 illustrated in FIG. 5C1. Thus, at that time, it is important that the stamp layer 12 does not peel off from the support plate 14.

As illustrated in FIG. 1A, the support plate 14 is detachably fixed to an adhesive surface 16*b* of the adapter plate 16 by an adhesive layer 15 on a surface opposite to the stamp layer 12. Adhesion between the support plate 14 and the adapter plate 16 by the adhesive layer 15 is adhesion sufficiently higher than the adhesion force F2 illustrated in FIG. 5B. However, the support plate 14 can be removed from the adhesive surface 16*b* of the adapter plate 16 when replacing the stamp layer 12 after repeated use. The adhesive layer 15 may include a double-sided adhesive tape, etc.

An X-axis direction width and a Y-axis direction width of the support plate 14 are preferably larger than those of the stamp layer 12, and larger than an X-axis direction width and a Y-axis direction width of the adhesive surface 16*b* of the adapter plate 16. On a surface of the support plate 14 on the stamp layer side, a flat adsorbable surface 14*b*, on which the stamp layer 12 is not formed, is formed around the stamp layer 12. In the present embodiment, the stamp layer 12 has a rectangular shape when viewed in the Z-axis direction. However, the support plate 14 may have a rectangular or circular shape. The adsorbable surface 14*b* can be detachably attached to an installation surface 84 of an installation stage 82 illustrated in FIG. 7.

An upper surface of the adapter plate 16 opposite to the adhesive surface 16*b* is a flat mounting surface 16*a*. At least both side surfaces of the adapter plate 16 in the X-axis direction are tapered surfaces 16*c* so that the area of the mounting surface 16*a* is larger than the area of the adhesive surface 16*b*. That is, the tapered surface 16*c*, outer diameters of which decrease toward the stamp layer 12, are formed on at least the side surfaces of the adapter plate 16 in the X-axis direction.

In the present embodiment, the tapered surfaces 16*c* are also formed on the both side surfaces of the adapter plate 16 in the Y-axis direction, and the tapered surfaces 16*c* are formed along the entire circumference of the side surfaces of the adapter plate 16. In the present embodiment, the adapter plate 16 has a rectangular shape when viewed in the Z-axis direction, and at least a maximum X-axis direction width of the adapter plate 16 is preferably larger than the X-axis direction width of the support plate 14. Note that as illustrated in FIG. 7, a maximum Y-axis direction width of the adapter plate 16 may be substantially equal to the Y-axis direction width of the support plate 14, or may be larger or smaller than the Y-axis direction width of the support plate 14.

On a surface of the support plate 14 opposite to the adsorbable surface 14*b* illustrated in FIG. 1A, a flat insertable surface 14*c* facing the tapered surfaces 16*c* is formed around the adhesive surface 16*b* of the adapter plate 16. On the insertable surface 14*c* located on both sides in the X-axis direction, a claw portion 26*a* of a chuck mechanism (also referred to as a clamping mechanism/first axis positioning mechanism) 26 illustrated in FIG. 2B is engaged with each of the tapered surfaces 16*c* of the adapter plate 16. In addition, an inclined surface 89 of a guide member 88 of an installation stage 82 illustrated in FIGS. 6A and 8 is engaged with each of the tapered surfaces 16*c* of the adapter plate 16 located on both sides in the X-axis direction.

A thickness of the adapter plate 16 illustrated in FIG. 1A in the Z-axis direction is sufficiently larger than the thickness of the support plate 14, and is preferably 1.2 times or more, and preferably about 2 to 6 times the thickness of the support plate 14. Note that an edge portion 16*d* including a chamfered portion or an R-portion is formed on an outer peripheral edge portion of the mounting surface 16*a* on the upper surface of the adapter plate 16.

Tip surfaces 92 of a pair of positioning members (second axis positioning mechanism) 90 illustrated in FIGS. 6A to 6C come into contact with edge portions 16*d* of the adapter plate 16 located on both sides in the Y-axis direction to position a Y-axis direction position of the stamp tool 10 placed on the installation stage 82. Rough positioning of an X-axis direction position of the stamp tool 10 is performed by the inclined surface 89 of the guide member 88 of illustrated in FIGS. 6A and 8, and accurate positioning is performed by a claw portion 26*a* of a clamping mechanism 26 of the transport device 20 illustrated in FIGS. 2B and 8.

(Transport Device)

Next, the transport device will be mainly described. An adsorbing surface 24 of the transport head 22 of the transport device 20 illustrated in FIG. 2A can be adsorbed to the mounting surface 16*a* on the upper surface of the adapter plate 16 illustrated in FIG. 1A. A vacuum suction hole serving as a primary attaching means is formed on the adsorbing surface 24 of the transport head 22, and by generating a negative pressure in the vacuum suction hole, the mounting surface 16*a* of the adapter plate 16 of the stamp tool 10 is vacuum-adsorbed to the adsorbing surface 24. A vacuum adsorption force of the adsorbing surface 24 to the mounting surface 16*a* of the adapter plate 16 of the stamp tool 10 is assumed to be a primary mounting force F3*a*.

In addition, in the present embodiment, the chuck mechanism 26 is attached on the transport head 22 via an opening/closing mechanism 28. The claw portion 26*a* is formed inside the chuck mechanism 26. The chuck mechanism 26 including the claw portion 26*a* is moved, for example, in the X-axis direction by the opening/closing mechanism 28, so that the claw portion 26*a* opens the entire lower surface of the adsorbing surface 24 as illustrated in FIG. 2A, or the claw portion 26*a* is located below each of both sides of the adsorbing surface 24 in the X-axis direction as illustrated in FIG. 2B.

A tapered engaging surface 26*b* is formed on each claw portion 26*a*. The tapered surface of the engaging surface 26*b* is adapted to a shape of the tapered surface 16*c* of the adapter plate 16 of the stamp tool 10, and can be engaged with the tapered surface 16*c*. As illustrated in FIGS. 2A and 2B, before the mounting surface 16*a* of the adapter plate 16 is adsorbed to the adsorbing surface 24 of the transport head 22, the claw portion 26*a* of the chuck mechanism 26 is opened by the opening/closing mechanism 28. After the mounting surface 16*a* of the adapter plate 16 is adsorbed to the adsorbing surface 24 of the transport head 22, the chuck mechanism 26 moves in a direction in which the claw portion 26*a* is closed by the opening/closing mechanism 28, and the engaging surface 26*b* is engaged with the tapered surface 16*c*.

As a result, the stamp tool 10 is attached on the transport head 22 with a total mounting force F3 of a primary mounting force F3*a* generated by a vacuum suction hole serving as a primary attaching means formed in the transport head 22 and a secondary mounting force F3*b* generated by the chuck mechanism 26 as serving as a secondary attaching means. As the transport head 22 becomes smaller, the primary mounting force F3*a* alone generated by the vacuum suction hole of the transport head 22 tends to hardly become larger than the fixing force F1 illustrated in FIG. 5B. In the present embodiment, when the secondary mounting force F3*b* generated by the chuck mechanism 26 serving as the secondary attaching means is added to the primary mounting force F3*a*, the total mounting force F3 (=F3*a*+F3*b*) reliably becomes larger than the fixing force F1.

In addition, by attaching the stamp tool 10 on the transport head 22 by the chuck mechanism 26, the stamp tool 10 (specifically, the projection of the stamp layer 12) is positioned with respect to the transport head 22 along the X-axis.

(Method of Manufacturing Display Element Array and Device Used for Manufacturing the Same)

Next, a description will be given of a method of manufacturing a display element array using the transport device 20 having the stamp tool 10 according to the present embodiment, an installation stage which is a part of a stamp tool positioning device, and other devices.

First, the transport device 20 illustrated in FIG. 2A picks up the stamp tool 10 disposed on the installation stage 82 illustrated in FIGS. 6A to 8. In the present embodiment, at least three stamp tools are preferably prepared, for example for the three primary colors of light R, G and B, and each stamp tool is preferably installed on each installation stage 82. Alternatively, the installation stage 82 is replaced with respect to a base 81 for each of the stamp tools 10 for R, G and B.

The base 81 of the installation stage 82 is positioned and fixed on the stamp table 100 illustrated in FIGS. 9 to 11. For example, the stamp table 100 is positioned and fixed on an integrated table 110. In examples illustrated in FIGS. 9 to 11, only a single stamp table is illustrated to be installed on the integrated table 110.

However, on the integrated table 110, for example, three stamp tables 100 to which respective bases 81 for three installation stages 82 are fixed, respectively, for the respective stamp tools 10 for R, G, and B may be arranged side by side at predetermined intervals in the Y-axis direction.

In addition, besides the three stamp tables 100, three large stamp tables, to which respective bases for three installation stages are fixed, respectively, may be further arranged side by side with predetermined intervals in the Y-axis direction for the respective stamp tools for R, G, and B having different sizes. These three large stamp tables having different sizes are arranged outside the three stamp tables 100 having smaller size in the X-axis direction.

In the present embodiment, as illustrated in FIGS. 9 to 11, on the integrated table 110, in addition to the stamp table 100, the element table 102 and the mounting table 104 are positioned and fixed. The element table 102 is a table on which the element forming substrate 30 illustrated in FIG. 5A is positioned and detachably fixed.

Note that FIGS. 9 to 11 illustrate that only the single element table 102 is installed. However, on the integrated table 110, for example, three element tables 102, on which three element forming substrates 30 are positioned and detachably fixed for the respective elements 32*r*, 32*g*, and 32*b* for R, G, and B, respectively, may be arranged side by side at predetermined intervals in the Y-axis direction. Alternatively, in the present embodiment, three element forming substrate element placement substrates 30 may be positioned and detachably fixed on a single element table 102. Note that the element table 102 and the stamp table 100 are disposed apart from each other in the X-axis direction on the integrated table 110.

The mounting table 104 is a table on which the mounting substrate 70 illustrated in FIG. 5C1 is positioned and detachably fixed. The mounting substrate 70 is disposed apart from the element table 102 in the Y-axis direction on the integrated table 110. In the present embodiment, a single mounting substrate 70 is positioned and fixed on the integrated table 110. Alternatively, a plurality of mounting substrates 70 may be positioned and fixed on the integrated table 110.

Upper surfaces of the respective tables 100, 102 and 104 positioned and fixed on the integrated table 110 are preferably in substantially the same X-Y plane. However, the upper surfaces do not have to be in the same plane. When the upper surfaces of the respective tables 100, 102 and 104 are in substantially the same X-Y plane, movement amount along the Z-axis of the transport head 22 relatively moved above the respective tables 100, 102 and 104 can be made substantially the same, and it becomes easy to control movement of the transport head 22 along the Z-axis. The transport head 22 of the transport device 20 can be moved in the X-axis and Y-axis directions and disposed above the respective tables 100, 102 and 104, which are positioned and fixed on the integrated table 110, in the Z-axis direction. The integrated table 110 is configured to be movable relative to the transport head 22 along the X-Y plane including the X-axis and the Y-axis.

To improve positioning accuracy, it is preferable that the transport head 22 moves relative to each of the tables 100, 102 and 104 only in the Z-axis direction, and each of the tables 100, 102 and 104 moves relative to transport head 22 along the X-Y plane. Alternatively, the transport head may move only in the X-axis or Y-axis and Z-axis directions, and the respective tables 100, 102 and 104 may move relative to the transport head 22 along the Y-axis or the X-axis. Alternatively, the transport head may move in the X-axis, the Y-axis and the Z-axis, and each of the tables 100, 102 and 104 may be fixed without moving.

In addition, even though the integrated table 110 illustrated in FIGS. 9 to 11 is illustrated as a single member, the integrated table 110 does not have to be configured as a single member and may be configured as a plurality of members. In addition, the element table 102 and the mounting table 104 may be positioned and fixed on the same base and may move in the same direction (for example, the Y-axis direction) in common. Further, apart from the tables 102 and 104, the integrated table 110 may be separated so that the stamp table 100 (including stamp tables having different sizes) moves, for example, in the Y-axis direction. In that case, the transport head 22 is preferably movable not only in the Z-axis direction but also in the X-axis direction.

In the following description, one installation stage 82 illustrated in FIGS. 6A to 8 will be described. However, the description is similarly applied to the other installation stages. As illustrated in FIGS. 6A and 7, the block-shaped installation stage 82 is installed on the base 81 in a detachable and replaceable manner using bolts, etc. As illustrated in FIG. 7, a housing recess 86 and the installation surface 84 surrounding the housing recess 86 are formed in an upper part of the installation stage 82 in the Z-axis direction. The housing recess 86 is formed, for example, by counterbore-molding a center of an upper surface of the square pole-shaped stage 82. As illustrated in FIG. 7, the housing recess 86 is adapted to completely accommodate the stamp layer 12 of the stamp tool 10.

In addition, suction holes 85 are formed at a plurality of locations in a circumferential direction on the installation surface 84 formed around the housing recess 86 to detachably adsorb and hold the adsorbable surface 14*b* of the support plate 14 on the installation surface 84. In addition, a plurality of gas flow holes 83 formed in the stage 82 communicates with the housing recess 86. By adsorbing the adsorbable surface 14*b* of the support plate 14 on the installation surface 84, the housing recess 86 can be sealed except for the gas flow holes 83. By allowing cleaning gas to flow into a housing space 86 through the gas flow holes 83, dust and impurities adhering to the stamp layer 12 can be discharged to the outside.

Two guide members 88 are detachably attached by bolts, etc. at each side of the stage 82 on both side surfaces substantially perpendicular to the X-axis. The inclined surface 89 is formed on an upper side of an inner surface of the guide member 88. The tapered surface 16*c* of the adapter plate 16 illustrated in FIG. 1A can be in contact with each inclined surface 89, and the tapered surface 16*c* of the adapter plate 16 facing in the X-axis direction slides along each inclined surface 89. Therefore, the adapter plate 16 of the stamp tool 10 is dropped onto the stage 82 while sliding on the inclined surface 89, and the stamp layer 12 is housed inside the housing recess 86 as illustrated in FIG. 7. In addition, rough positioning of the stamp tool 10 with respect to the stage 82 in the X-axis direction is performed.

As illustrated in FIG. 6A, four guide members 88 are attached to the stage 82 so as to be located inside both edge portions 16*d* of the adapter plate 16 of the stamp tool 10 in the Y-axis direction. The positioning members (second axis positioning mechanism) 90 in the Y-axis direction are disposed on both sides of the stage 82 in the Y-axis direction so as to be movable in the Y-axis direction. The tip surfaces 92 are formed on the positioning members 90, respectively, these tip surfaces 92 face each other along the Y-axis, and each of the tip surfaces 92 can come into contact with the edge portion 16*d* of the adapter plate 16 in the Y-axis direction as illustrated in FIG. 7. The stamp tool 10 is positioned with respect to the stage 82 in the Y-axis direction by the tip surface 92 coming into contact with the edge portion 16*d* of the adapter plate 16 in the Y-axis direction.

Next, a description will be given of a method of picking up the stamp tool 10 from the installation stage 82 illustrated in FIGS. 6A and 7 using the transport device 20 illustrated in FIG. 2A.

First, the positioning members 90 are used to position the stamp tool 10 on the stage 82 in the Y-axis direction. Thereafter, as illustrated in FIG. 9, a positional relationship of the X-Y axis between the stamp table 100 and the transport head 22 is changed, the stage 82 illustrated in FIG. 8 moves together with the base 81, and the stage 82 is positioned below the transport head 22 of the transport device 20 as illustrated in FIG. 2A. Note that the transport head 22 may be moved without moving the stage 82, or both of the transport head 22 and the stage 82 may be moved. The transport head 22 may be rotated around the Z-axis as necessary.

After the stamp tool 10 on the stage 82 is positioned under the transport head 22 in the Z-axis, the head 22 is moved downward along the Z-axis so that a lower end of the transport head 22 is brought into contact with the mounting surface 16*a* of the adapter plate 16, and vacuum adsorption by the transport head 22 is started. Next, as illustrated from FIG. 2A to FIG. 2B, the clamping mechanism 26 is closed, and the engaging surfaces 26*b* of the claw portions 26*a* are engaged with the tapered surfaces 16*c* located on both sides of the adapter plate 16 in the X-axis direction, respectively, to perform positioning in the X-axis direction. In addition, positioning of the stamp tool 10 in the X-axis direction may be performed by preparing a stopper surface as necessary on the engaging surfaces 26*b* of the claw portion 26*a*, and brining the stopper surface into contact with the edge portion 16*d* of the adapter plate 16 in the X-axis direction.

Thereafter, the pair of positioning members 90 illustrated in FIG. 7 are opened in the Y-axis direction to release contact between the edge portion 16*d* of the adapter plate 16 and the tip surface 92. Before and after the release, adsorption of the support plate 14 to the installation surface 84 of the stage by the suction holes 85 of the stage 82 is released. Thereafter, when the transport head 22 is moved upward along the Z-axis, as illustrated in FIG. 2B, the stamp tool 10 is positioned at a lower end of the transport head 22 in the X-axis and Y-axis and is held in a state where levelness of the stamp tool 10 is maintained.

Next, in a state where the stamp tool 10 is attached on the transport head 22 as illustrated in FIG. 2B, the transport device 20 is relatively moved in the X-axis and Y-axis directions, and is located on the element table 102 as illustrated in FIG. 10. As illustrated in FIG. 10, the multi-element transfer device 200 includes an imaging device 122, which serves as an imaging means capable of performing simultaneous imaging in two directions, allowed to enter a space between a surface of the element forming substrate 30 (see FIG. 3A) installed on the element table 102 and the stamp layer 12 of the stamp tool 10 held by the transport head 22. Note that the imaging device 122 may be retracted from under the transport head 22. In addition, when the transport head 22 moves on the mounting table 104, a similar imaging device 122 may be inserted therebetween.

As illustrated in FIG. 3A, the imaging device 122 can simultaneously capture images of the projection 11 (see FIG. 2B) on the stamp surface of the stamp layer 12 and the surface of the element forming substrate 30. As illustrated in FIG. 10, the imaging device 122 is communicatively connected to a control device 120 as control means. The control device 120 receives a detection signal from the imaging device 122 and controls a fine adjustment mechanism (not illustrated) that changes a relative position between the transport head 22 and the device forming substrate 30.

The fine adjustment mechanism may include a mechanism for finely adjusting a relative position of the transport head 22 with respect to the substrate 30 along the X-axis and the Y-axis, and a mechanism for finely adjusting a relative angle of the transport head 22 with respect to the substrate 30 around the Z-axis. In addition, the mechanism for finely adjusting a relative position of the transport head 22 with respect to the substrate 30 along the X-axis and the Y-axis may be included in a main drive device for changing a relative position of the transport head 22 with respect to the element table 102 (mounting table 104 or stamp table) along the X-axis and the Y-axis. The main drive device and fine control mechanism are controlled by control device 120. In addition, the control device 120 also controls Z-axis direction movement of the transport device 20 including the transport head 22 illustrated in FIG. 8, driving of the chuck mechanism 26, driving of the positioning members 90 illustrated in FIG. 6A.

On the element table 102 illustrated in FIG. 10, the element forming substrate 30 is positioned and disposed as illustrated in FIG. 3A. As illustrated in FIG. 5A, on the surface of the element forming substrate 30, for example, an element 32*r* for red light emission, an element 32*g* for green light emission, or an element 32*b* for blue light emission is incorporated. The substrate 30 may be, for example, a sapphire substrate, a glass substrate, a GaAs substrate, a SiC substrate, etc., depending on the type of device (blue light emitting device, red light emitting device, green light emitting device, etc.).

In the present embodiment, the elements 32*r*, 32*g*, and 32*b* are, for example, micro LED elements. Note that in the following description, only the element 32*r* will be described. However, the other elements 32*g* and 32*b* are also processed in a similar manner using separate stamp tools 10, respectively. The stamp tool 10 is preferably prepared for each type of the different elements 32*r*, 32*g*, and 32*b*. However, the transport head 22 may be used in common.

The stamp tool 10 in a standby state is disposed, for example, on the stage 82 illustrated in FIGS. 6A and 7, and the stamp layer 12 is sealed inside the housing recess 86 and kept clean. The stamp tool 10 in the standby state not held by the transport head 22 may be disposed, for example, on the stamp table 100 illustrated in FIG. 9, and may be disposed on separate stamping tables disposed next to each other along the Y-axis of the table 100 illustrated in FIG. 9.

The imaging device 122 illustrated in FIG. 3A simultaneously captures images of the projections 11 (see FIG. 2B) on the stamp surface of the stamp layer 12 and the surface of the element forming substrate 30, a detection signal thereof is received by the control device 120 illustrated in FIG. 10, and a relative position between the transport head 22 and the element forming substrate 30 illustrated in FIG. 3A is changed using the fine control mechanism. As a result, arrangement of the projections 11 on the stamp surface of the stamp layer 12 and arrangement of the element 32*r* formed on the surface of the substrate 30 are accurately positioned. As a result, a large number of small-sized elements 32*r* may be held on the stamp surface of the stamp layer 12 with high accuracy.

Thereafter, as illustrated from FIG. 3A to FIG. 3B, after the imaging device 122 is moved from a position below the transport head 22 and retracted, the transport device 20 is moved downward in the Z-axis direction to press the projection 11 of the stamp tool 10 against an upper surface of the element 32*r* of the substrate 30. As a result, the element 32*r* adheres to the projection 11. Thereafter, as illustrated in FIG. 3C, the stamp tool 10 is lifted upward in the Z-axis direction together with the transport device 20. As a result, as illustrated in FIG. 5B, the element 32*r* adheres to each projection 11, and the element 32*r* is picked up from the substrate 30 together with the projection 11. The element 32*r* left on the substrate 30 is similarly picked up by the stamp layer 12 of the transport device 20 later.

Next, for example, the elements 32*r* picked up by the projections 11 of the stamp layer 12 are transported by the transport device 20 onto the mounting substrate (the substrate may be a sheet/which is similarly applied hereinafter) 70 illustrated in FIG. 5C1 and mounted. The mounting substrate 70 illustrated in FIG. 5C1 is positioned and disposed on the mounting table 104 illustrated in FIG. 10. Therefore, as illustrated in FIGS. 10 and 11, the main drive device is driven by the control device 120, the element table 102 and the mounting table 104 are moved relative to the transport head 22 in the Y-axis direction, and the transport head 22 is positioned on the mounting table.

Thereafter, an array of the elements 32*r* adhering to the projections 11 of the stamp layer 12 illustrated in FIG. 5B is transferred onto the mounting substrate 70 illustrated in FIG. 5C1. To this end, the elements 32*r* adhering to the projections 11 of the stamp layer 12 are pressed against the surface of the mounting substrate 70, and then the stamp layer 12 is lifted together with the transport device 20. As a result, a plurality of elements 32*r* is transferred to the surface of the mounting substrate 70 at the same time. By repeating the above operation according to the size of the mounting substrate 70, a plurality of elements 32*r* is disposed in a matrix on the mounting substrate 70. The stamp tool 10 after use is returned to the stage 82 of an original stamp tool holding device 80 installed on the stamp table 100 by the transport head 22.

As illustrated in FIG. 5C1, the other elements 32*g* and 32*b* are also transported to the substrate 70 in a similar manner as described above using the stamp tool 10, which is different for each type of the elements 32*g* and 32*b*. Three elements 32*r*, 32*g*, and 32*b* of R, G, and B constitute one pixel unit, and by disposing these pixel units in a matrix, a color display screen can be obtained.

It is preferable that anisotropic conductive paste (ACP) is applied to the surface of the mounting substrate 70. Alternatively, it is preferable that an anisotropic conductive film (ACF) is disposed thereon. As illustrated in FIG. 5C1, after disposing the elements 32*r*, 32*g*, and 32*b* on the substrate 70 via the ACP or ACF, the respective elements 32*r*, 32*g*, and 32*b* may be pressed toward the substrate 70 and heated using a heating/pressurizing device (not illustrated). As a result, the terminals of each of the elements 32*r*, 32*g*, and 32*b* can be connected to the circuit pattern of the mounting substrate.

In the transport device 20 according to the present embodiment, the mounting force F3 to the mounting surface 16*a* of the adapter plate 16 by the transport head 22 illustrated in FIG. 2B is greater than the fixing force F1 illustrated in FIG. 5B, and the adhesion force F2 of the projection 11 of the stamp layer 12 on the element 32*r* is greater than the fixing force F1. Therefore, the stamp tool 10 can easily pick up the element 32*r* disposed on the surface of the substrate 30 from the substrate 30 and transport the element 32*r* without being left on the substrate 30 side.

In addition, in the present embodiment, the mounting force F3 to the mounting surface 16*a* of the adapter plate 16 by the transport head 22 illustrated in FIG. 2B is a sum of the primary mounting force F3*a* corresponding to the adsorption force of the vacuum suction hole and the secondary mounting force F3*b* generated by the clamping mechanism 26 serving as the secondary attaching means. That is, in the present embodiment, only by providing the clamping mechanism 26 to a general transport head 22 having a vacuum suction hole, it becomes easy to set the mounting force F3 to the mounting surface 16*a* of the adapter plate 16 by the transport head 22 to be greater than the fixing force F1 of the element 32*r* to the substrate 30 illustrated in FIG. 5B.

Further, in the present embodiment, on both side surfaces of the adapter plate 16 in the X-axis direction, the tapered surfaces 16*c* are formed to decrease in outer diameter toward the stamp layer 12. In addition, the claw portion 26*a* of the clamping mechanism 26 can be engaged with the tapered surface 16*c*. With this configuration, the claw portion 26*a* of the clamping mechanism 26 can be easily engaged with the tapered surface 16*c* on the side surface of the adapter plate 16 in a detachable manner. In addition, the mounting force F3 of the stamp tool 10 to the transport head 22 by the clamping mechanism 26 can be increased. In addition, by detachably engaging the claw portion 26*a* of the clamping mechanism 26 with the tapered surface 16*c* on the side surface of the adapter plate 16, the stamp tool 10 can be positioned with respect to the transport head 22 in the X-axis direction at the same time.

In addition, when the tapered surfaces 16*c* are formed to decrease in outer diameter toward the stamp layer 12 on both side surfaces of the adapter plate 16 in the X-axis direction, rough positioning of the stamp tool 10 in the X-axis direction is facilitated along the inclined surface 89 of the guide member 88 installed in an upper part of the stage 82 illustrated in FIG. 6A. In particular, as illustrated in FIG. 1A, when the maximum width of the adapter plate 16 in the X-axis direction is larger than the width of the support plate 14, the inclined surface 89 of the guide member 88 and the tapered surface 16*c* of the stamp tool 10 are easily engaged with each other.

In addition, the presence of the insertable surface 14*c* on the support plate 14 of the stamp tool 10 facilitates detachable engagement of the claw portion 26*a* of the clamping mechanism 26 with the tapered surface 16*c* on the side surface of the adapter plate 16. A reason therefor is that, since a space is formed between the insertable surface 14*c* and the tapered surface 16*c* due to the presence of the insertable surface 14*c*, an engagement start position can be determined based on the space in positioning when starting engagement of the claw portion 26*a* of the clamping mechanism 26 with the tapered surface 16*c*. Further, when the adsorbable surface 14*b* is present on the support plate 14 of the stamp tool 10, as illustrated in FIG. 7, the support plate 14 can be adsorbed to the installation surface 84 of the stage 82, and the stamp layer 12 is easily sealed and held inside the housing recess 86. The adsorbable surface 14*b* can be easily formed around the stamp layer 12 by configuring the support plate 14 using a glass plate, etc.

The stamp tool 10 further includes the support plate 14 to which the stamp layer 12 is fixed and to which an adapter plate 16 is replaceably attached. With this configuration, only the support plate 14 to which the stamp layer 12 is fixed can be replaced from the adapter plate 16 without replacing the entire stamp tool 10. Therefore, it becomes easy to prepare the stamp tool 10 having different types of stamp layers 12 at a low cost. In addition, by using the adapter plate 16 in common, it is unnecessary to use different types of transport heads in accordance with the stamp tools, and the overall structure of the transport device can be simplified.

In the present embodiment, the plurality of projections 11 corresponding to the elements 32*r* (32*g*, 32*b*) is formed on the stamp layer 12, and the elements 32*r* (32*g*, 32*b*) detachably adhere to the respective projections 11. With this configuration, a plurality of elements 32*r* (32*g*, 32*b*) may be taken out from the substrate 30 at the same time. In the element array manufacturing method of the present embodiment, an element array having the plurality of elements 32*r* (32*g*, 32*b*) can be easily manufactured.

In addition, in the present embodiment, as illustrated in FIG. 6A, the installation stage 82 is replaceably attached to the base 81. Therefore, the stage 82 corresponding to the stamp tool 10 may be prepared, and only the stage 82 may be replaced when changing to a different type of stamp tool 10. Since a degree of flatness of the stage 82 is ensured with respect to the base 81, there is no need to adjust a degree of flatness of the stamp tool 10 when the stamp tool 10 is replaced.

Therefore, in the present embodiment, the transport head 22 can favorably pick up the stamp tool 10 from the installation stage 82 without causing an error in adsorption by the transport head 22 or an error in gripping by the clamping mechanism 26.

As illustrated in FIG. 7, in the stamp tool holding device 80 according to the present embodiment, by introducing a negative pressure into the suction hole 85 in a state where the stamp layer 12 is accommodated inside the housing recess 86, the adapter plate 16 of the stamp tool 10 is detachably adsorbed to the installation surface 84. As a result, the inside of the housing recess 86 is sealed, dirt, dust, etc. are less likely to adhere to the stamp surface (projections 11) of the stamp layer 12 accommodated inside the housing recess 86, and the stamp tool 10 may be installed while keeping the stamp surface clean.

In addition, in the present embodiment, the installation stage 82 is detachably fixed to the base 81. The stamp tool 10 needs to be replaced according to a request from a customer, the substrate 30 on which the element serving as the transport object element is built, etc. By preparing a plurality of installation stages 82 according to a change of the stamp tool 10, the base 81 does not need to be replaced, and by exchanging only the installation stage 82, the size of the stamp tool 10 may be changed. In addition, a degree of flatness of each installation stage 82 with respect to the base 81 is ensured, and there is no need to adjust the degree of flatness when the stamp tool 10 is replaced.

Further, in the present embodiment, a gas flow hole 83 that communicates with a space inside the housing recess 86 to replace gas inside the housing recess 86 is formed in the installation stage 82. By replacing gas in the recess 86, dirt, dust, etc. adhering to the surface of the stamp layer 12 accommodated inside the housing recess 86 can be discharged together with the gas, and a degree of cleanliness of the stamp layer 12 can be improved.

As illustrated in FIG. 6A, in the present embodiment, the guide member 88 is attached in the upper part of the installation stage 82 to guide the stamp layer 12 of the stamp tool 10 at least along the X-axis so that the stamp layer 12 falls inside the housing recess 86. By providing the guide member 88 on the installation stage 82, rough positioning of the stamp tool 10 at least along the X-axis is facilitated. In addition, when the stamp tool 10 is picked up by the transport head 22, positioning of the stamp tool 10 with respect to the transport head 22 is facilitated.

In the present embodiment, the guide member 88 is detachably attached on each of both sides of the installation stage 82 along the X-axis, and the inclined surface 89 that can be engaged with the tapered surface 16*c* of the stamp tool 10 is formed on each guide member 88. With such a configuration, rough positioning of the stamp tool 10 at least along the X-axis is further facilitated. In addition, when the stamp tool 10 is picked up by the transport head 22, positioning of the stamp tool 10 with respect to the transport head 22 is further facilitated.

In the present embodiment, at least two guide members 88 are attached on each of both sides of the installation stage 82 along the X-axis, and the claw portion 26*a* of the chuck mechanism 26 illustrated in FIG. 2A is insertable along a gap between the two guide members 88. Such a configuration enables highly accurate positioning of the stamp tool 10 at least along the X-axis. In addition, when the stamp tool 10 is picked up by the transport head 22, positioning of the stamp tool 10 with respect to the transport head 22 (especially positioning along the X-axis) becomes even more accurate.

As illustrated in FIGS. 6A to 6C, a pair of positioning members 90, which can move to come into contact with and be separated from the edge portions 16*d* of the stamp tool 10 installed in the upper part of the installation stage 82, is disposed on both sides of the installation stage 82 along the Y-axis direction. With such a configuration, it is possible to perform highly accurate positioning of the stamp tool 10 along the Y-axis in addition to the X-axis. In addition, when the stamp tool 10 is picked up by the transport head 22, positioning of the stamp tool 10 with respect to the transport head 22 is further facilitated.

In addition, the stamp tool positioning device of the present embodiment includes the installation stage 82 illustrated in FIG. 7, the transport head 22 illustrated in FIG. 8, the clamping mechanism 26 serving as the first axis positioning mechanism, and the positioning member 90 serving as the second axis positioning mechanism. That is, in the present embodiment, positioning of the stamp tool 10 along the Y-axis is performed using the positioning members 90 with reference to the installation stage 82 as illustrated in FIG. 7, and positioning of the stamp tool 10 along the X-axis may be performed using the clamping mechanism 26 with reference to the transport head 22 as illustrated in FIG. 2B. Therefore, the positioning mechanism for the transport head 22 can be simplified, and the transport head can be made lighter. As a result, driving control of the transport head 22 is facilitated, and transport position accuracy of the transport head 22 is improved.

In addition, in the stamp tool positioning device of the present embodiment, while positioning of the stamp tool 10 along the Y-axis is performed with respect to the installation stage 82, accurate positioning of the stamp tool 10 along the X-axis is unnecessary. Therefore, a positioning mechanism of the installation stage 82 is simplified, and a space required for the installation stage 82 can be minimized. Therefore, movement control of the installation stage 82 is facilitated. Further, for example, positioning between the installation stage 82 and the transport head 22 may be performed with high accuracy only along the Y-axis, and positioning along the X-axis may be rough. A reason therefor is that positioning of the stamp tool 10 along the X-axis is performed by the clamping mechanism 26 with reference to the transport head 22.

In addition, in the present embodiment, the clamping mechanism 26 also serves as a attaching means for detachably attaching the stamp tool 10 on the transport head 22. Since the clamping mechanism 26 serving as the attaching means also serves as a positioning mechanism, it becomes unnecessary to equip the transport head 22 with a separate positioning mechanism as a part other than the attaching means.

In the multi-element transfer device 200 according to the present embodiment illustrated in FIG. 10, the stamp tool 10 is attached to the stage 82 of the stamp table 100 so that the mounting surface 16*a* faces upward along the Z-axis as illustrated in FIG. 8. In addition, as illustrated in FIG. 10, the element table 102 and the mounting table 104 are relatively movable with respect to the transport head 22 at least along the Y-axis, and the stamp table 100 is relatively movable with respect to the transport head 22 at least along the X axis.

Therefore, the transport head 22 is relatively movable over the stamp table 100, the element table 102, and the mounting table 104. In addition, using the stamp tool 10 held by the transport head 22, the plurality of elements 32*r* (32*g*, 32*b*) may be simultaneously transferred from the surface of the element forming substrate 30 of the element table 102 to the surface of the mounting substrate 70 of the mounting table 104. In addition, the stamp tool 10 after transferring the elements 32*r* from the element forming substrate 30 to the mounting substrate 70 is returned to the original installation stage 82 of the stamp table 100 by using the transport head 22. As described above, in the multi-element transfer device 200 of the present embodiment, the stamp tool 10 may be used to efficiently transfer the plurality of elements 32*r* (32*g*, 32*b*).

In addition, when a plurality of types of elements 32*r*, 32*g*, and 32*b* is transferred from a plurality of element forming substrates 30 corresponding thereto, respectively, to the single mounting substrate 70, the respective elements 32*r*, 32*g*, and 32*b* may be transferred using different types of stamp tools 10. Therefore, it is easy to transfer the elements 32*r*, 32*g*, and 32*b* of different types to the single mounting substrate 70 in a set arrangement, and for example, it is easy to efficiently manufacture an element array having few pixel defects.

A method of manufacturing an element array of the present embodiment includes a process of transporting the stamp tool 10 positioned by the stamp tool positioning device using the transport head 22, and a process of simultaneously taking out and transporting the elements 32*r* (32*g*, 32*b*) serving as the plurality of transport object elements from the substrate 30 using the stamp tool 10 attached on the transport head 22.

In the method of manufacturing the element array of the present embodiment, the element array having the plurality of elements positioned and arranged with high precision may be easily manufactured in a short time and at a low cost.

A method of manufacturing an element array according to another embodiment includes a process of preparing stamp tool holding devices 80, the number of which is equal to or greater than the number of substrates 30 on which the plurality of types of elements serving as the transport object elements is disposed, respectively, a process of installing the stamp tool 10 prepared for each of the plurality of types of elements on each of the stamp tool holding devices 80, a process of picking up the stamp tool 10 held by each stamp tool holding device 80 corresponding to each substrate 30 from the stamp tool holding device 80 using the transport head 22, and simultaneously taking out and transporting the plurality of elements 32*r* (or 32*g*, 32*b*) using the stamp tool 10 attached on the transport head 22 from the substrate 30 corresponding to the stamp tool 10 picked up, and a process of returning the stamp tool 10 after the plurality of elements 32*r* (or 32*g*, 32*b*) is taken out to the corresponding empty stamp tool holding device 80 after the plurality of elements 32*r* (or 32*g*, 32*b*) is simultaneously taken out and transported.

In the method of manufacturing the element array according to the present embodiment, the element array in which the plurality of types of elements 32*r*, 32*g*, and 32*b* is arranged may be easily manufactured in a short time and at a low cost. Moreover, since the stamp tool 10 used in accordance with each substrate 30 corresponding to each of the plurality of types of elements 32*r*, 32*g*, and 32*b* is installed and stored in the dedicated stamp tool holding device 80, it is easy to maintain a degree of cleanliness of the stamp surface of each stamp tool 10 at a high level while effectively preventing misalignment of the elements 32*r*, 32*g*, and 32*b*.

Second Embodiment

As illustrated in FIG. 1B, in a stamp tool 10*a* used in a transport device of the present embodiment, a shim plate 18 is interposed between the stamp layer 12 and the adapter plate 16 to adjust a degree of parallelism of the support plate 14. An inclined surface 14*a* is formed on a part of a side surface of the support plate, and the shim plate 18 is engaged with the inclined surface 14*a* so that the degree of parallelism of the support plate 14 can be adjusted. The degree of parallelism of the support plate 14 can be adjusted using a mode in which the shim plate 18 is installed between the support plate 14 and the adapter plate 16 via the adhesive layer 15.

Note that since the purpose of installing the shim plate 18 is to adjust a degree of parallelism, a position where the shim plate 18 is installed is not limited thereto. The shim plate 18 may be installed across the entire periphery of the adapter plate 16, or may be installed intermittently. For example, as illustrated in FIGS. 1C, 1D, and 1E, adhesive layers 15 may be provided at four corners of the adapter plate 16, and shim plates 18 may be provided only at two locations on one side in the Y-axis direction between the adhesive surface 16*b* and the support plate 14 with the adhesive layer 15 interposed therebetween. With this configuration, when the adapter plate 16 (or the support plate 14) has a rectangular shape, a small amount of degree of parallelism can be adjusted.

That is, as illustrated in FIG. 1C, when the adapter plate 16 (or the support plate 14) has a rectangular shape, the degree of parallelism can be adjusted by disposing the shim plate 18 on one of opposing sides. In addition, when the adapter plate 16 (or the support plate 14) has a circular shape, the degree of parallelism can be adjusted by disposing the shim plate 18 in one of circular arc regions at point-symmetrical positions.

More specifically, for example, as illustrated in FIG. 1E, when a thickness of the stamp layer 12 varies along the Y-axis direction, the shim plate 18 may be disposed in a gap between the support plate 14 and the adapter plate 16 on one side in the Y-axis direction. In this way, the mounting surface 16*a* and a stamp surface of the stamp layer 12 become parallel to each other, and the degree of parallelism can be adjusted. Note that, in FIG. 1E, in order to facilitate description, thicknesses and inclinations of the stamp layer 12, the shim plate 18, and the adhesive layer 15 are illustrated to be larger than actual thicknesses and inclinations.

Other configurations and effects of the transport device and the stamp tool of the present embodiment are the same as those of the first embodiment, and a detailed description thereof will be omitted.

Third Embodiment

As illustrated in FIG. 4A, in the transport device of the present embodiment, an elastically deformable engaging projection 26*c* is attached on the engaging surface 26*b* of the claw portion 26*a* of the chuck mechanism 26, and the engaging projection 26*c* can be engaged with the tapered surface 16*c* of the adapter plate 16. The engaging projection 26*c* is made of, for example, a spring material, and may protrude in an arc shape from the engaging surface 26*b*. In addition, as illustrated in FIG. 4B, the engaging surface 26*b* does not have to be a flat surface, and may be a convex curved surface that can be engaged with the tapered surface 16*c* of the adapter plate 16. Other configurations and effects of the transport device and the stamp tool of the present embodiment are the same as those of the first or second embodiment, and a detailed description thereof will be omitted.

Fourth Embodiment

In the present embodiment, a description will be given of a method of mounting an element by a transfer method using the device according to any one of the first to third embodiments described above. In the following description, description of a part overlapping with the first to third embodiments described above will be omitted.

In the method of the present embodiment, as illustrated in FIG. 5B, the element 32*r* picked up by the projection 11 of the stamp layer 10 is transferred onto a first transfer substrate (second substrate) 50 illustrated in FIG. 5C2 by the transport device 20 and disposed on an adhesion layer 52.

An array of elements 32*r* adhering to the projections 11 of the stamp layer 12 illustrated in FIG. 5B is transferred onto the adhesion layer 52 of the substrate 50 made of an adhesion sheet, etc. illustrated in FIG. 5C2. To this end, the elements 32*r* adhering to the projections 11 of the stamp layer 12 are pressed against a surface of the adhesion layer 52, and then the stamp layer 12 is lifted together with the transport device 20. As a result, a plurality of elements 32*r* is simultaneously transferred to the surface of the adhesion layer 52. Note that, therebefore, the transport device 20 illustrated in FIG. 3C is moved onto the substrate 50 illustrated in FIG. 5C2 by a transport mechanism of the transport device 20.

Adhesion of the adhesion layer 52 of the adhesion sheet made of the substrate 50 is adjusted so that adhesion of the adhesion layer 52 becomes greater than adhesion of the projections 11. The adhesion layer 52 is made of, for example, an adhesive resin such as natural rubber, synthetic rubber, acrylic resin, or silicone rubber, and a thickness z4 thereof is preferably about 0.5 to 2.0 times a height z2 of the element 32*r* (see FIG. 5B). Note that, in order to smooth movement of the element 32*r* from the projection 11 to the adhesion layer 52, an operation (for example, applying heat) may be added to facilitate peeling of the element 32*r* from the projection 11.

Other elements 32*g* and 32*b* are also transferred to the adhesion layer 52 of the substrate 50 in the same manner as described above. Three elements 32*r*, 32*g*, and 32*b* of R, G, and B form one pixel unit, and pixel units may be disposed in a matrix to form a color display screen.

Next, as illustrated in FIG. 5D, the entire array of the three elements 32*r*, 32*g*, and 32*b* disposed on the surface of the first transfer substrate 50 is transferred to an adhesion layer 62 of a second transfer substrate 60, so that respective terminals of the elements 32*r*, 32*g*, and 32*b* are disposed to face the outside of the substrate 60. For this transfer, a technique such as a laser lift method may be used, and a transfer method using a difference in adhesion, a transfer method involving heat peeling, etc. may be used. With the terminals of the elements 32*r*, 32*g*, and 32*b* facing the outside of the substrate 60, a tin plating film may be formed on each terminal using an electroless plating method, etc.

Next, as illustrated in FIGS. 5E and 5F, the entire array of the three elements 32*r*, 32*g*, and 32*b* is transferred from the adhesion layer 62 of the substrate 60 to the mounting substrate 70. For the transfer, a technique such as the laser lift method may be used, and a transfer method using a difference in adhesion, a transfer method involving heat peeling, etc. may be used.

Note that, after the transfer, in order to connect the terminal of each of the elements 32*r*, 32*g*, and 32*b* to a circuit pattern of the mounting substrate, for example, it is preferable that anisotropic conductive paste (ACP) is applied to the surface of the mounting substrate 70, or an anisotropic conductive film (ACF) is disposed thereon. As illustrated in FIG. 5F, after disposing the elements 32*r*, 32*g*, and 32*b* on the substrate 70 via the ACP or ACF, the respective elements 32*r*, 32*g*, and 32*b* may be pressed toward the substrate 70 and heated using a heating/pressurizing device (not illustrated). As a result, the terminals of each of the elements 32*r*, 32*g*, and 32*b* can be connected to the circuit pattern of the mounting substrate.

Note that the present invention is not limited to the above-described embodiments, and various modifications can be made within the scope of the present invention.

For example, the stamp tool is not limited to the stamp tool 10 of the embodiment described above, and other stamp tools can be used. The transport head 22 may be provided with at least one of an electrostatic adsorption mechanism, a fitting mechanism, and a screwing mechanism as a secondary attaching means other than the clamping mechanism 26. In addition, in the transport head 22, an electrostatic adsorbing mechanism, a fitting mechanism, or a screwing mechanism may be used as the first axis positioning mechanism other than the clamping mechanism 26. By providing these mechanisms in the transport head, the stamp tool 10 can be easily positioned with respect to the transport head 22.

In addition, in the above-described embodiments, as the primary attaching means of the transport head 22, vacuum adsorption using vacuum suction holes is used. However, in the present invention, it may be unnecessary to use vacuum adsorption, and the stamp tool 10 may be detachably attached on the transport head 22 only by the first axis positioning mechanism such as the clamping mechanism 26. In addition, in the above-described embodiments, when positioning can be performed without using the clamping mechanism 26, and the stamp tool 10 can be detachably held with sufficient holding force with respect to the transport head 22, a vacuum adsorbing mechanism or an electrostatic adsorbing mechanism may be attached on the transport head. Alternatively, as the primary attaching means other than the clamping mechanism 26, an electrostatic adsorbing mechanism, a fitting mechanism, a screwing mechanism, or other attachment/detachment devices may be attached on the transport head 22.

Further, the stamp tool held by the stamp tool holding device according to the embodiments described above is not limited to the stamp tool 10 described above, and may be other stamp tools.

Further, in the above-described embodiments, as illustrated in FIG. 8, a single stamp table 100 is prepared for each single installation stage 82. However, the plurality of these stamp tables 100 is all driven in the same manner along the X-axis and/or the Y-axis, and thus may be regarded as the single stamp table 100. It is obvious that three or more installation stages 82 may be disposed on the single stamp table 100. In addition, similarly, as illustrated in FIG. 3A, the single element table 102 is prepared for each single element forming substrate 30. However, the plurality of these element tables 102 is all driven in the same manner along the X-axis and/or the Y-axis, and thus may be regarded as the single element table 102. It is obvious that three or more element forming substrates 30 may be disposed on the single element table 102.

In addition, the transport device 20 having the stamp tool positioning device according to the present embodiment is used to pick up the elements 32*r* (32*g*, 32*b*) from the element forming substrate 30. However, the application is not limited thereto, and the transport device 20 may be used to pick up the elements 32*r* (32*g*, 32*b*) from a substrate (sheet) having an adhesion layer transferred from the substrate 30 by the laser lift method, etc.

In addition, the transport device 20 having the stamp tool positioning device according to the present embodiment may be used to pick up an element other than the elements 32*r*, 32*g*, and 32*b* for red, green, and blue light emission. A fluorescent element, etc. may be indicated as another display element. In addition, the other element is not limited to the display element, and may be an electronic element such as a light receiving element, a ceramic capacitor, or a chip inductor, or a semiconductor element.

EXPLANATIONS OF LETTERS OR NUMERALS

- 10 STAMP TOOL
  - 11 PROJECTION
  - 12 STAMP LAYER
  - 14 SUPPORT PLATE
    - 14*a* INCLINED SURFACE
    - 14*b* ADSORBABLE SURFACE
    - 14*c* INSERTABLE SURFACE
  - 15 ADHESIVE LAYER
  - 16 ADAPTER PLATE
    - 16*a* MOUNTING SURFACE
    - 16*b* ADHESIVE SURFACE
    - 16*c* TAPERED SURFACE
    - 16*d* EDGE PORTION
  - 18 SHIM PLATE
- 20 TRANSPORT DEVICE

22 TRANSPORT HEAD
24 ADSORBING SURFACE
26 CHUCK MECHANISM (FIRST AXIS POSITIONING MECHANISM)
26*a* CLAW PORTION
26*b* ENGAGING SURFACE
26*c* ENGAGING PROJECTION
28 OPENING/CLOSING MECHANISM
30 ELEMENT FORMING SUBSTRATE (FIRST SUBSTRATE/ELEMENT PLACEMENT SUBSTRATE)
32*r*, 32*g*, 32*b* ELEMENT
50 FIRST TRANSFER SUBSTRATE (SECOND SUBSTRATE/SHEET)
52 ADHESION LAYER
60 SECOND TRANSFER SUBSTRATE (SHEET)
62 ADHESION LAYER
70 MOUNTING SUBSTRATE (SECOND SUBSTRATE/SHEET)
80 STAMP TOOL HOLDING DEVICE
81 BASE
82 STAGE
83 GAS FLOW HOLE
84 INSTALLATION SURFACE
85 SUCTION HOLE
86 HOUSING RECESS
88 GUIDE MEMBER
89 INCLINED SURFACE
90 POSITIONING MEMBER (SECOND AXIS POSITIONING MECHANISM)
92 TIP SURFACE
100 STAMP TABLE
102 ELEMENT TABLE (FIRST TABLE)
104 MOUNTING TABLE (SECOND TABLE)
110 INTEGRATED TABLE
120 CONTROL DEVICE (CONTROL MEANS)
122 IMAGING DEVICE (IMAGING MEANS)
200 MULTI-ELEMENT TRANSFER DEVICE

The invention claimed is:

1. A stamp tool holding device comprising:

an installation stage for a stamp tool including a stamp layer having a portion configured to detachably adhere to a transport object element, the stamp tool being detachably installed on the installation stage, wherein the installation stage has an installation surface configured to detachably suction a part of the stamp tool, and a housing recess, which is surrounded by the installation surface and is configured to accommodate the stamp layer, the housing recess has a bottom surface lower than the installation surface, and a suction hole configured to detachably suction the part of the stamp tool is within the installation surface so that the part of the stamp tool seals the suction hole from the housing recess when suction is applied through the suction hole to the part of the stamp tool.

2. The stamp tool holding device according to claim 1, wherein the installation stage is detachably fixed to a base.

3. The stamp tool holding device according to claim 1, wherein a gas flow hole for communicating with a space inside the housing recess to replace gas inside the housing recess is in the installation stage, and the gas flow hole is at an inner location relative to the suction hole.

4. The stamp tool holding device according to claim 1, wherein a guide means is on an upper part of the installation stage at least along a first axis so that the stamp layer of the stamp tool drops into the housing recess.

5. The stamp tool holding device according to claim 4, wherein:

the guide means includes guide members that are detachable and on both sides of the installation stage along the first axis; and an inclined surface configured to be engaged with a tapered surface of the stamp tool is on each of the guide members.

6. The stamp tool holding device according to claim 5, wherein:

at least two guide members are on each of the both sides of the installation stage along the first axis; and a claw portion of a chuck mechanism is insertable along a gap between the two guide members.

7. The stamp tool holding device according to claim 1, further comprising a pair of positioning members on both sides of the installation stage along a second axis direction and configured to move to come into contact with and be separated from edge portions of the stamp tool on an upper part of the installation stage.

8. The stamp tool holding device according to claim 1, wherein the housing recess is formed so as to surround the stamp layer.

9. The stamp tool holding device according to claim 1, wherein the housing recess completely surrounds the stamp layer with a clearance therebetween.

10. A method of manufacturing an element array, the method comprising:

picking up a stamp tool held by the stamp tool holding device according to claim 1 using a transport head; and taking out transport object elements simultaneously from a substrate and transport them using the stamp tool attached on the transport head.

11. A method of manufacturing an element array, the method comprising:

preparing stamp tool holding devices according to claim 1, the number of which is equal to or greater than the number of substrates, each of the substrates has a plurality of types of elements serving as the transport object element installing a stamp tool prepared for each of the plurality of types of elements on each of the stamp tool holding devices;

picking up the stamp tool held by each of the stamp tool holding devices corresponding to each of the substrates from the stamp tool holding device using a transport head, and taking out the elements simultaneously and transporting them using the stamp tool attached on the transport head from a substrate corresponding to the stamp tool picked up; and returning the stamp tool after the elements are taken out to a corresponding one of the stamp tool holding devices after the elements are simultaneously taken out and transported.

* * * * *